US012795883B2

(12) United States Patent
Chen et al.

(10) Patent No.: US 12,795,883 B2
(45) Date of Patent: Nov. 10, 2026

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Wei-Hua Chen, Hsinchu (TW); Kuan-Chung Chiu, Hsinchu (TW); Chieh Lee, Hsinchu (TW); Chun-Ying Lee, Hsinchu (TW); Chia-En Huang, Hsinchu (TW); Yi-Ching Liu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 570 days.

(21) Appl. No.: 18/350,521

(22) Filed: Jul. 11, 2023

(65) Prior Publication Data

US 2025/0024657 A1 Jan. 16, 2025

(51) Int. Cl.

| | |
|---|---|
| ***H10D 30/67*** | (2025.01) |
| ***H10B 10/00*** | (2023.01) |
| ***H10D 30/01*** | (2025.01) |
| ***H10D 30/47*** | (2025.01) |
| ***H10D 62/10*** | (2025.01) |
| ***H10D 84/01*** | (2026.01) |
| ***H10W 20/41*** | (2026.01) |
| ***H10W 20/42*** | (2026.01) |

(52) U.S. Cl.
CPC ........... *H10B 10/125* (2023.02); *H10D 30/01* (2025.01); *H10D 30/47* (2025.01); *H10D 30/6757* (2025.01); *H10D 62/118* (2025.01); *H10D 84/0128* (2025.01); *H10D 84/0135* (2025.01); *H10D 84/0149* (2025.01); *H10W 20/42* (2026.01); *H10W 20/435* (2026.01)

(58) Field of Classification Search
CPC .... H10B 10/125; H10D 30/47; H10D 30/017; H10D 30/6728; H10D 30/01; H10D 84/0128; H10D 84/0135; H10D 84/0148; H10W 20/42; H10W 20/435
See application file for complete search history.

(56) References Cited

U.S. PATENT DOCUMENTS

| | | | | |
|---|---|---|---|---|
| 9,236,300 | B2 * | 1/2016 | Liaw | H10W 20/0698 |
| 10,043,571 | B1 * | 8/2018 | Liaw | H10B 10/12 |
| 10,461,086 | B2 * | 10/2019 | Liaw | H10B 10/12 |
| 11,257,824 | B1 * | 2/2022 | Yang | H10B 10/12 |

(Continued)

FOREIGN PATENT DOCUMENTS

| | | |
|---|---|---|
| TW | 202109749 A | 3/2021 |
| TW | 202236635 A | 9/2022 |

*Primary Examiner* — Galina G Yushina
(74) *Attorney, Agent, or Firm* — Foley & Lardner LLP

(57) ABSTRACT

A method includes depositing a metal to form a gate layer for a first memory cell in a metallization layer of the semiconductor device. The method includes forming a plurality of semiconductor channels separated from the gate layer by a gate oxide layer. The method includes defining a plurality of gates from the gate layer. The method includes interconnecting the plurality of gates and the plurality of semiconductor channels to form a memory cell, wherein the interconnection comprises a plurality of mezzanine levels.

20 Claims, 37 Drawing Sheets

(56) References Cited

U.S. PATENT DOCUMENTS

| | | | | |
|---|---|---|---|---|
| 11,723,194 | B2 * | 8/2023 | Lin | H10B 20/30 |
| 2016/0307882 | A1 * | 10/2016 | Chen | H10D 89/10 |
| 2020/0343185 | A1 * | 10/2020 | Chang | H10D 89/10 |

* cited by examiner

100

300

300

300

300

300

300

SEMICONDUCTOR DEVICES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
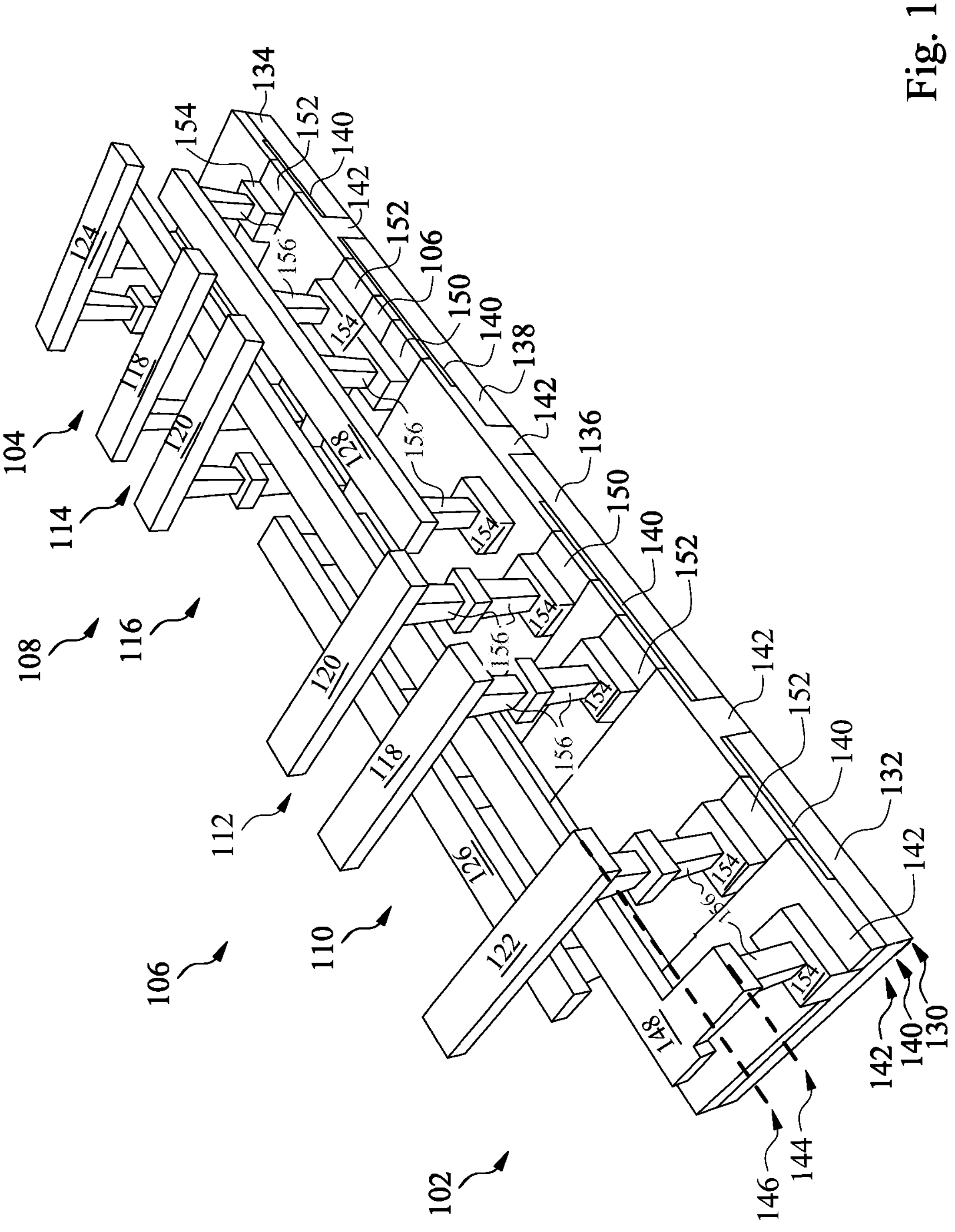
FIG. 1 is an of a mezzanine memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices may employ memory devices such as SRAM memories to implement registers, caches, and the like. The semiconductor devices can include a semiconductor die having an active surface. The active surface may include various logic, memory, power management, or other transistors, diodes, fuses, and the like. For example, the various devices may include interconnections from a first metallization layer, M0, disposed over the semiconductor die. Subsequent metallization levels (e.g., M1, M2, M3, and so forth) can interconnect the first metallization layer to further interconnect the silicon die, or to connect the silicon die to further silicon dies, other devices, or terminals of a semiconductor package. Conductors of the M0 layer may be constrained by a feature size of the silicon die, and any N-wells or P-wells may be constrained by design rules associated with the semiconductor die. The performance (e.g., access time, power use, etc.) of memories and other devices formed along the active surface of the semiconductor device may vary according to a capacitance or resistance of interconnections. Moreover, increasing a memory size may lead to a corresponding increase in die size which may lower yields, performance, raise costs, and so forth.

In general, the present disclosure is directed to memory devices formed along metallization layers of a semiconductor device. Such layers may be formed according to back end of line (BEOL) processes. BEOL processes includes manufacturing processes creating metal interconnects on multiple layers of a semiconductor device, such as to facilitate flow of electrical signals between different components of the semiconductor device such as dies or terminals. BEOL processes may omit or relax various design rules relative to front end of line (FEOL) processes. FEOL processes include fabrication of components such as transistors and diodes along an active surface of a semiconductor wafer. Design rules for FEOL processes can include smaller minimum feature distances, such as to manufacture the transistors and diodes which may be greater than for metal interconnects. FEOL design rules can apply for memories formed at an active surface of the semiconductor die, while maintaining FEOL rules for other devices formed over the active surface (e.g., transistor logic, such as for a microcontroller). One or more layers of a semiconductor device can include a gate, gate oxide, channel, and interconnects for a memory cell. For example, the memory cell can include a static random access memory (SRAM) cell such as an six transistor (6 T), eight transistor (8 T) or other transistor cell.

The metallization layer can include larger, lower resistance interconnects than lower levels of the metallization structure which may have greater spacing therebetween, such that memory cells disclosed herein may exhibit lower power use, lower capacitance, or faster access time than corresponding memories formed along an active surface of the die. Moreover, various such layers may be vertically spaced along a semiconductor device (e.g., stacked). Various portions of the memory devices can include different gate oxide thicknesses, channel dimensions, and the like, such that a threshold voltage, leakage current, or the like may vary between one or more memory cells. For example, various layers of the semiconductor device can include a high performance cell having a relatively low access time and a relatively high leakage, a low power cell having a relatively high access time and a relatively low leakage, or a balanced cell having a moderate access time and leakage associated therewith.

Figure 2:
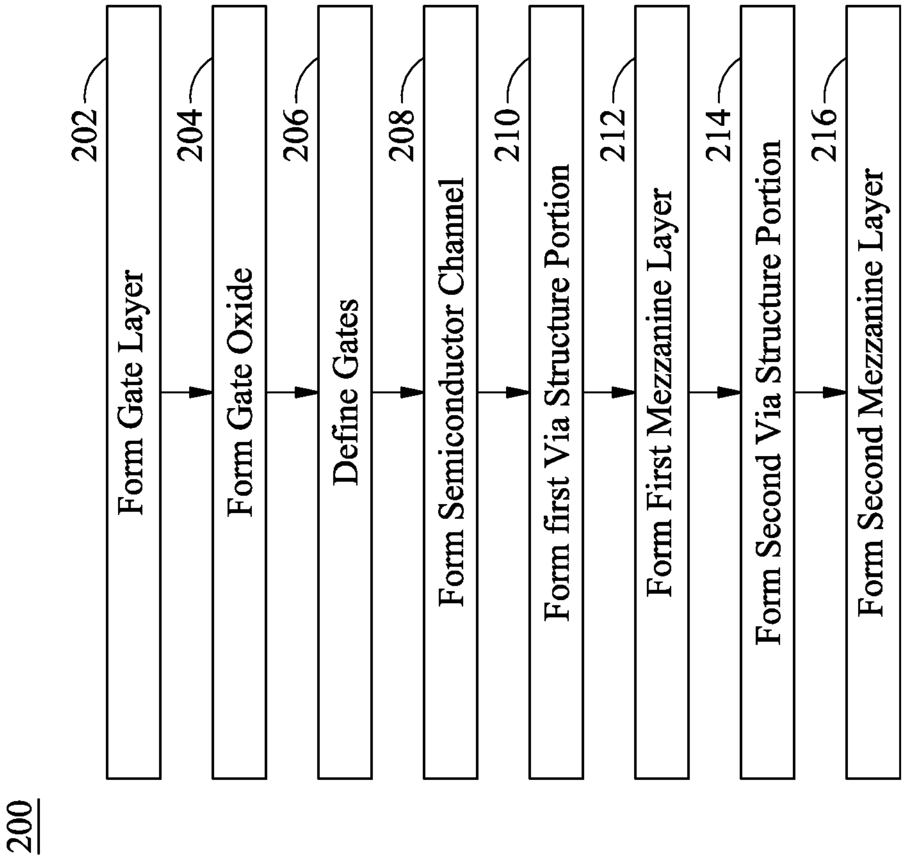
FIG. 2 is an example flow chart of a method for fabricating a semiconductor device, in accordance with some embodiments.

FIG. 1 includes an example of a mezzanine memory cell 100, in accordance with some embodiments, which may be helpful to understand the method 200 of FIG. 2. A mezzanine memory cell can include or refer to a memory cell 100 having a channel and interconnects formed from metallization layers of a semiconductor device. For example, the depicted memory cell 100 may be one of various memory cells manufactured according to the operations of FIG. 2. More particularly, the depicted memory cell 100 is an 6 T SRAM cell. The memory cell 100 includes a gate layer 130 which may be formed in a BEOL process. For example, the memory cell 100 may be formed over an active surface of a semiconductor die or may be formed in a semiconductor device which does not include a semiconductor die. The memory cell 100 includes a first access transistor 102 and a second access transistor 104 gating access to the logical state of the device (e.g., to a flip-flop comprising a first inverter 106 cross-coupled with a second inverter 108). The gate layer 130 can include word line gates 132, 134 of each of the first access transistor 102 and second access transistor 104. The gates can selectively connect the state of the memory cell 100 to be read out between a first bit line 122 and a second bit line 124.

The gate layer 130 includes a first inverter gate 136 for the first inverter 106 and a second inverter gate 138 for the second inverter 108. The first inverter 106 includes a first pull down transistor 110 connecting a first voltage level (e.g., VSS) at a source/drain thereof, a first pull up transistor 112 connecting a second voltage level (e.g., VDD) at a drain/source thereof, and the first inverter gate 136. The second inverter 108 includes a second pull down transistor 114 connecting the first voltage level at a source/drain thereof, a second pull up transistor 116 connecting the second voltage level at a drain/source thereof, and the second inverter 108.

A gate oxide layer 140 intermediates the channels of the various transistors from the gate layer 130. A dielectric 142 can electrically isolate the various gates 132, 134, 136, 138 of the gate layer 130. According to various embodiments, a same or another dielectric 142 (e.g., silicon dioxide) can extend over further portions of the memory cell 100. For example, the dielectric 142 can occupy the depicted negative spaces, shown removed for clarity of the other features of the memory cell 100.

Semi-conductive channels can be disposed over the gate oxide layer 140. For example, the channels can include N-type channels 150 or P-type channels 152. Various embodiments of the present disclosure can employ various channel types for various transistors. For example, the depicted mezzanine memory cell 100 includes four P-type channels 152 to form four P-type transistors and two N-type channels 154 to form two N-type transistors. The circuit of FIG. 12, hereinafter, depicts two P-type channels 152 to form two P-type transistors and four N-type channels 154 to form four N-type transistors. The semi-conductive channels can interface with electrical contacts 154 (e.g., source/drains) for to connect to via structures 156.

Interconnections of the memory cell may be made at a plurality of vertically spaced levels. For example, via structures 156 can extend between the gate or channel and a first mezzanine level 144 of the memory cell 100, for each of the gates. As depicted, the first mezzanine level 144 includes conductive elements including: the word line 148 connecting the gates of the access transistors 102, 104; the storage node 126 connecting a gate of the second inverter 108 to a node connecting to the source/drain of the first pull up transistor 110, the first pull down transistor 112, and the source/drain of the first access transistor 102; and the complementary storage node 128 connecting a gate of the first inverter 106 to a node connecting to the source/drain of the second pull up transistor 116, the second pull down transistor 114 116, and the source/drain of the second access transistor 104.

The via structures 156 can further extend to a second mezzanine level 146 of the memory cell 100. As depicted, a source/drain of the first pull up transistor 110 and second pull down transistor 114 connects to conductive element at a first voltage level 118 (e.g., VSS); a source/drain of the first pull down transistor 112 and second pull up transistor 116 connects to conductive element at a second voltage level 120 (e.g., VDD). The second mezzanine level 146 can further include a connection to a first bit line 122 and a second bit line 124. The via structures 156 can include or interface with further conductive elements, such as a conductive metal on the first mezzanine level 144 or second mezzanine level 146, or a conductive contact intermediate to a channel or gate. In various embodiments, such as embodiments employing additional transistors, the interconnection may connect on a third or further mezzanine level (not depicted).

FIG. 2 includes a flowchart of a method 200 of fabricating a semiconductor device, in accordance with some embodiments. For example, at least some of the operations described in the method 200 may result in the semiconductor devices depicted in FIG. 1, or FIGS. 3-13B. The disclosed method 200 is disclosed as a non-limiting example, and additional operations may be provided before, during, and after the method 200 of FIG. 2. Further, some operations may only be described briefly herein, however, one skilled in the art will understand that the disclosed operations may be performed in conjunction with other disclosed methods disclosed herein, or generally known in the art. For example, it is noted that the present method contemplates forming a controller and I/O along a same lateral plane as the depicted memory cell, connecting various memory cells vertically offset from each other, connecting the various memory cells as registers, words, or the like to convey data between the cell and the semiconductor die or terminal connection of the semiconductor device. Further, the order of the disclosed operations is not intended to be limiting; certain operations may be performed in a different sequence, and still further operations may be sequenced with appropriate modifications thereto.

In brief summary, the method 200 includes operation 202, of forming a gate layer of the semiconductor device. The method 200 further includes operation 204, wherein a gate oxide is formed over the gate layer. The method 200 further includes operation 206, wherein various gates are defined from the gate layer. The method 200 further includes operation 208, wherein various semiconductor channels are formed. At operation 210, a first via structure portion is formed. The via structure portion can include a source/drain connection or a riser portion of a via. At operation 212, a first mezzanine level is formed. At operation 214, a second via structure portion is formed. At operation 216, a second mezzanine level is formed.

Figure 3:
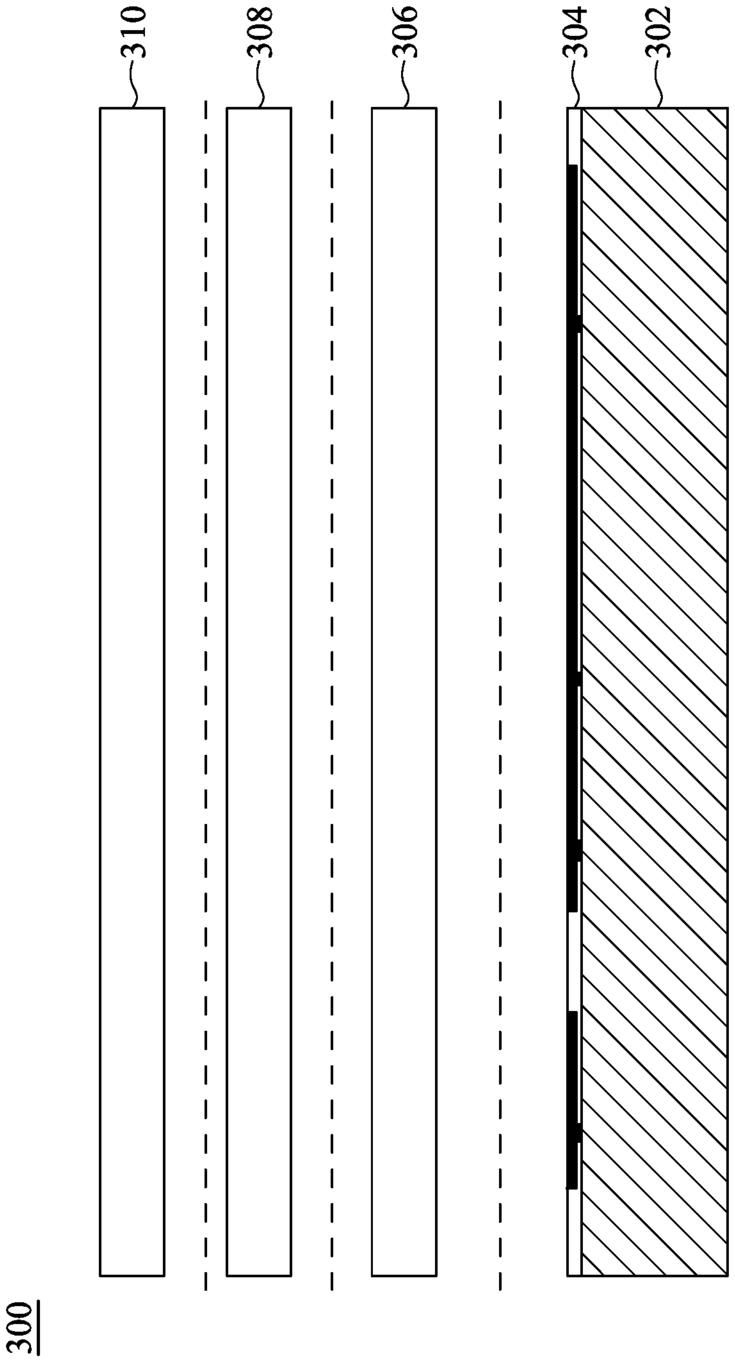
FIGS. 3, 4, 5, 6, 7A, 7B, 8A, 8B, 9A, 9B, 10A, 10B, 11A, and 11B illustrate top and cross-sectional views of an example semiconductor device during various fabrication stages, made by the method of FIG. 2, in accordance with some embodiments.

Corresponding to operation 202 of the method 200 of FIG. 2, FIG. 3 is a cross sectional view of a gate layer 306 of a semiconductor device 300. For example, the gate layer 306 can be formed over a semiconductor die 302. The semiconductor die 302 can be a semiconductor substrate such as a polysilicon wafer with an active surface comprising various doped surfaces. Metallization layers 304 can interconnect respective portions of the active surface to form circuits therebetween. The metallization layers 304 can vary in feature dimensions such that layers proximal to the semiconductor die 302 may be smaller than feature dimensions distal therefrom. The metallization layers 304 can connect to terminals such as micro-bumps, copper pillars, or another connection structure along an opposite face of the metallization layers 304 than the semiconductor die 302. The metallization layers 304 can include various conductive materials such as copper, lead, silver, tin, aluminum, or the like. The metallization layers 304 can include alternating conductive elements extending along a lateral surface of the device with via structures extending vertically to electrically connect the conductive elements. The metallization layers 304 can be made from one or more materials such as a same material for different layers, a different material for different layers, or a combination of layers (e.g., a bimetallic via). According to various embodiments, various numbers of metallization layers 304 can be employed (e.g., according to a complexity or density of circuits on an active face of the semiconductor die 302, a number or type of desired memory cells, or the like). For example, at least about 5 or about 10 metallization layers 304 can intermediate the semiconductor die 302 from the depicted gate layer 306, according to some embodiments.

The gate layer 306 can be one of the metallization layers 304. For example, the gate layer 306 can be a metallization layer 304 employing a same or different material. In various embodiments, the gate layer 306 can be formed from Tantalum Nitride (TaN), Titanium Nitride (TIN), Tungsten (W), Aluminum (Al), polycrystalline silicon (poly-Si), combinations thereof, and the like. The gate layer 306 can include one or more same or varying materials to electrically connect to the other of the metallization layers 304. The metallization layer 304 can be deposited by varying processes, such as by a physical vapor deposition (PVD) or chemical vapor deposition (CVD), electroplating, or the like.

In some embodiments, the gate layer 306 may not be formed over a semiconductor die 302. For example, the gate layer 306 can be formed over a dielectric layer including terminal connections. The terminal connections may thereafter be employed as a memory device, such as a memory device for a printed circuit board to couple with a controller, input and outputs, or the like. The memory device can be coupled to another device including one or more logic circuits (e.g., a controller) to access the memory device (e.g., store information thereon or retrieve stored information therefrom).

Subsequent to operation 202, further gate layers such as a second gate layer 308, a third gate layer 310, and so forth, can be formed according to the processes described herein with regard to the gate layer 306. Further memory cells 100 can be formed along each of the second gate layer 308 and third gate layer 310, and connected by one or more via structures. Along with the further memory cells 100, memory controllers, input or output connections (I/O) for data signals, line drivers, and the like can be formed on a vertical portion of the semiconductor device 300 corresponding to the various gate layers. Each layer of further memory cells may be configured to operate at a same or varying leakage level, access speed, or the like. Merely for clarity of depiction and brevity, the second gate layer 308 and third gate layer 310 are omitted from FIGS. 4-12. Further figured generally corresponding to FIGS. 4-12 could indicate the formation of the second memory cell 100 over the first memory cell, and a third memory cell over the second memory cell. An example of a semiconductor device 300 including multiple gate layers is provided with regard FIGS. 14 and 23C.

Figure 4:
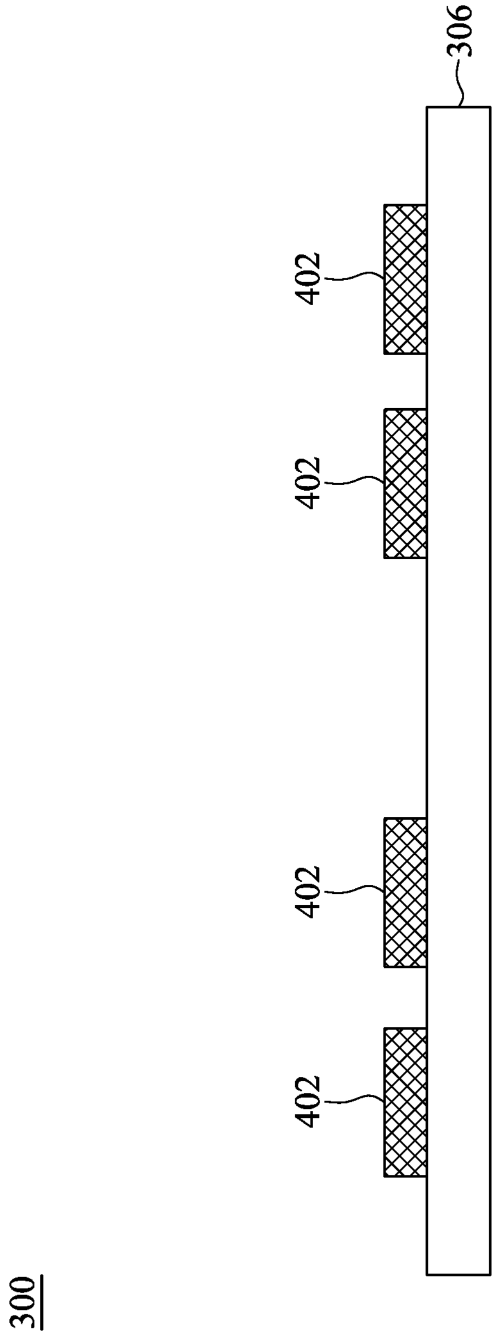

Corresponding to operation 204 of the method 200 of FIG. 2, FIG. 4 is a cross-sectional view of a semiconductor device 300, wherein a gate oxide 402 is formed over the gate layer 306. The gate oxide layer 140 can be formed over the gate layer 306 and thereafter patterned to form the depicted gate oxide 402. The oxide thickness can be selected according to a desired property of a memory cell such as a target access time or leakage current. Additional or fewer gate oxide 402 portions may be formed according to a memory cell type. For example, an 8 T or 10 T SRAM memory cell 100 can include additional gate oxide 402 portions.

In a non-limiting example, the gate oxide 402 can be formed from a high-k dielectric material such as hafnium dioxide ($HfO_2$), deposited using atomic layer deposition (ALD) or chemical vapor deposition (CVD) processes employing Hf and $O_2$ precursors. Another dielectric such as silicon dioxide ($SiO_2$), aluminum oxide ($Al_2O_3$), silicon oxynitride (SiON) can be deposited using CVD, plasma-enhanced chemical vapor deposition (PECVD), spin-on-glass (SOG), or ALD, or so forth, within the scope of the present disclosure. A positive or negative photoresist process which is selective between the gate oxide 402 and the gate layer 306 can remove a portion of the gate oxide 402 to pattern a gate oxide 402 layer which corresponds to semiconductor channel locations. Each contiguous gate oxide 402 portion may correspond to a location for one or more semiconductor channels over a lateral surface of the semiconductor device 300.

Figure 5:
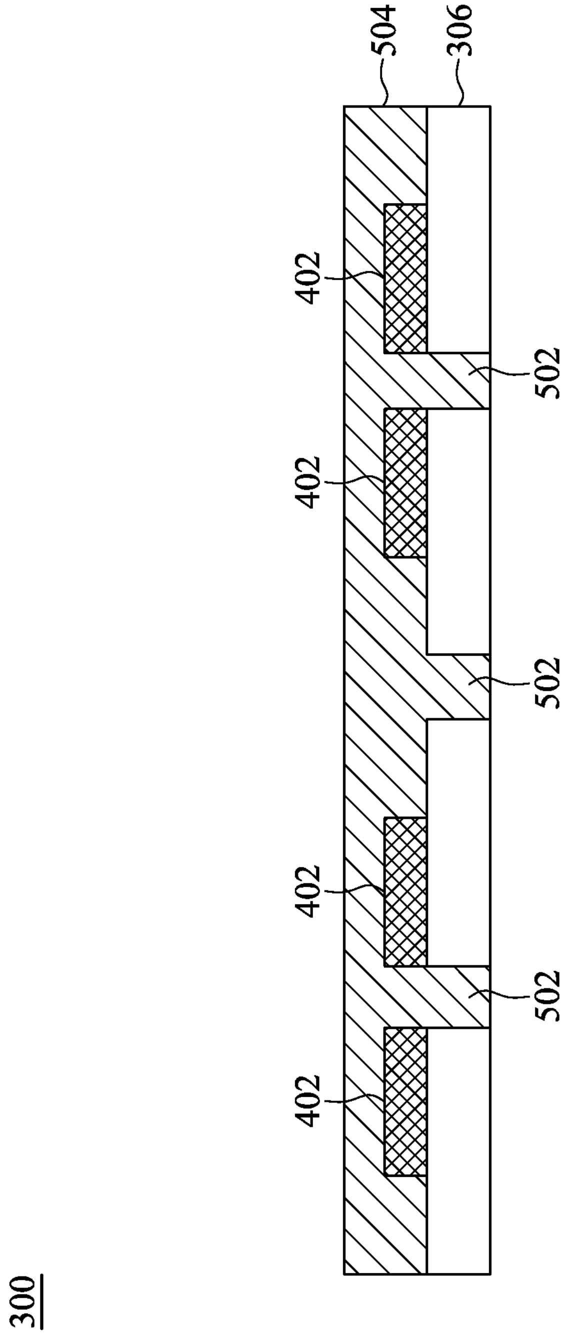

Corresponding to operation 206 of the method 200 of FIG. 2, FIG. 5 is a cross sectional view of the semiconductor device 300, wherein gate isolation trenches 502 are formed to electrically isolate various portions of the gate layer 306 from each other. The isolated portions of the gate layer 306 can include one or more gate oxides 402 formed there-over. Like other operations of the depicted method 200, the operations can be performed in various orders. For example, the gate oxide 402 may be deposited subsequent or prior to the formation of the gate isolation trenches 502.

In some embodiments, the gate isolation trenches 502 are formed through the gate oxide 402 as well as the gate layer 306. An isolation oxide 504 or other dielectric can occupy the gate isolation trenches 502 to provide mechanical support and increase electrical isolation. The isolation oxide 504 can include any of the gate oxides 402 referred to at FIG. 4, or other isolation dielectric materials, and may also be referred to as an inter-layer dielectric (ILD). For example, the ILD can include $SiO_2$, SiON, $Si_3N_4$, $HfO_2$, $Al_2O_3$, combinations thereof or the like. In some embodiments, the ILD (isolation oxide 504) is formed from a same material as the gate oxide 402. In some embodiments, the ILD is formed from a material which is selectively etchable relative to the gate oxide 402, or the semiconductor channels 602 discussed henceforth with regard to FIG. 6. An isolation oxide 504 can be selectively removed to form contacts electrically connected to the gate layer 306 (e.g., the first via structure portion contact 702 of FIGS. 7A and 7B), or the first via structure portion contacts 702 can be electrically connected to the gate layer 306 prior to forming the isolation oxide 504 over the gate layer 306. Further portions of the gate layer 306 can be defined to form a controller for the memory cell 100 formed according to the present method 200, conductive elements for a word line driver, and so forth. Further portions still can form interconnects, such as to convey data from memory cells 100 or logic devices disposed vertically spaced from the memory cell 100 of the present method 200.

Figure 6:
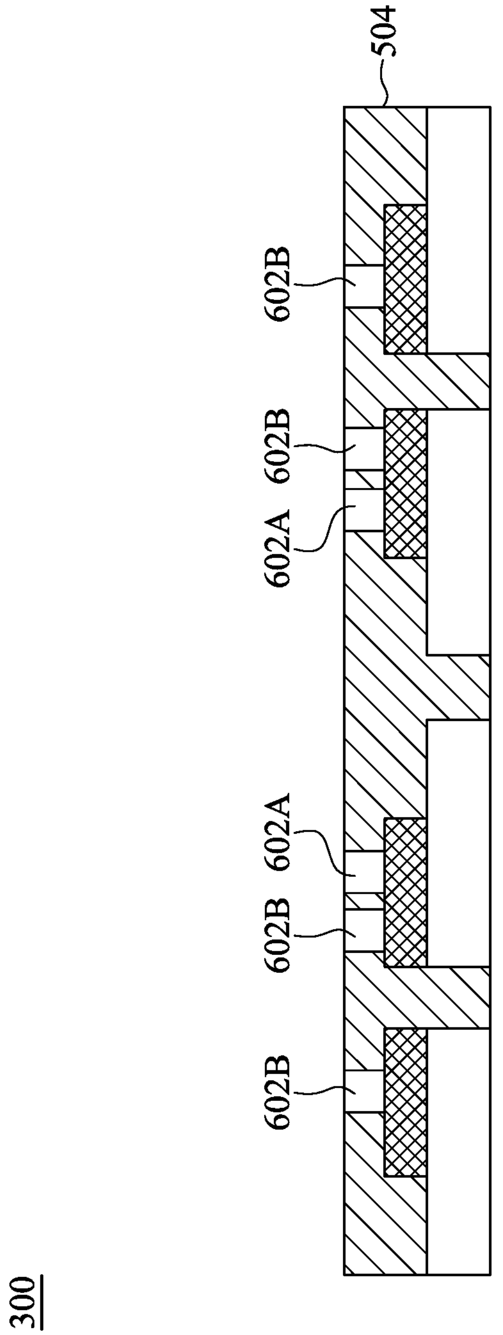

Corresponding to operation 208 of the method 200 of FIG. 2, FIG. 6 is a top view of a semiconductor device 300, wherein semiconductor channels 602 are formed over the gate oxide 402. The semiconductor channels 602 can include at least one n-type channel 602A and at least one p-type channel 602B. As indicated above, the various features provided herein are not drawn to scale. According to various embodiments, different transistors can be configured with different geometries which may corresponded to different drive strengths. For example, a length or width of a p-type channel 602B can be adjusted to match a drive strength of an n-type channel 602A. Further, one p-type channel 602B or n-type channel 602A can be a different dimension from another semiconductor channel 602 of the same type. For example, a semiconductor channel 602 for an access transistor can be of different geometry corresponding to a higher drive strength (e.g., wider channel), lower leakage power (e.g., longer channel), or the like, relative to a semiconductor channel 602 for a pull-up or pull-down transistor.

Moreover, the semiconductor channels 602 may vary according to a lateral or vertical location of a device. For example, a first layer of the device can include various memory cells 100, word line drivers, and controllers corresponding to the memory cells. The memory cells 100 of the layer can be of a same or different type. For example, the memory cells 100 of the layer can include various voltage thresholds, leakage currents, or configurations of p-type and n-type channels for various transistor memory cell implementations. Various layers of the semiconductor device 300 can employ a same or different material for the n-type channel 602A or p-type channel 602B. For example, one or more layers may include indium gallium zinc oxide (IGZO), zinc oxide (ZnO), indium (III) oxide ($In_2O_3$), tin (IV) oxide ($SnO_2$), indium gallium arsenide (InGaAs), carbon nanotube (CNT), transition metal dichalcogenide (TMD), or black phosphorus nanoribbon (BPNR), combinations thereof, or the like for an n-type channel 602A. Likewise, one or more layer may include nickel oxide (NiO), copper (I) oxide ($Cu_2O$), copper aluminum oxide ($CuAlO_2$), copper gallium oxide ($CuGaO_2$), copper indium oxide ($CuInO_2$), strontium copper oxide ($SrCu_2O_2$), tin(II) oxide (SnO), combinations thereof, or the like for a p-type channel 602B.

In various embodiments, either of the n-type channel 602A or p-type channel 602B can be formed according to a patterning process, and thereafter, the other of the n-type channel 602A or p-type channel 602B can be formed.

Figure 7A:
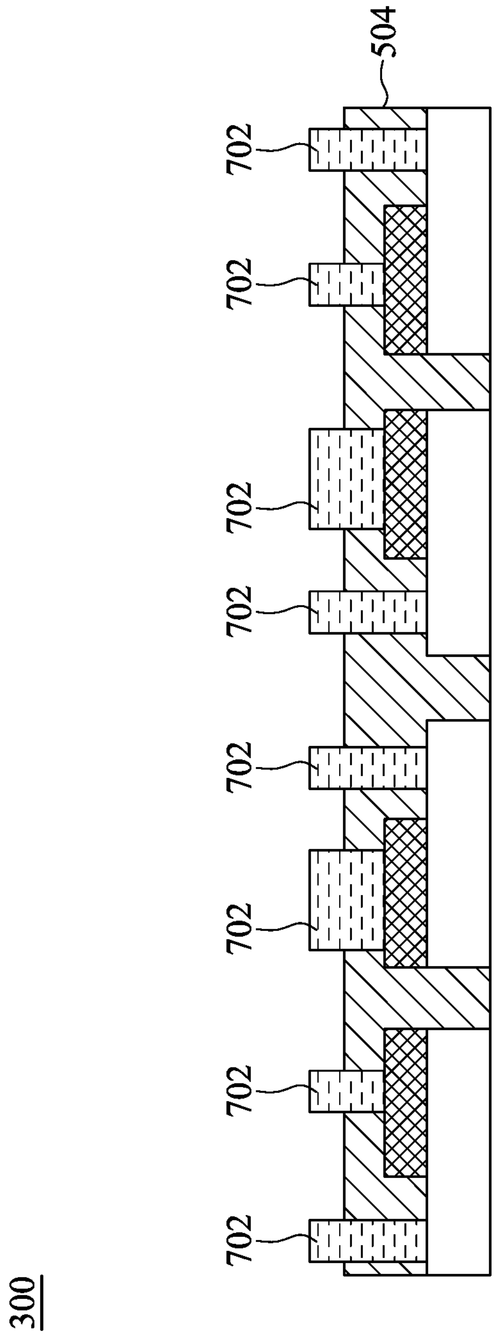
Figure 7B:
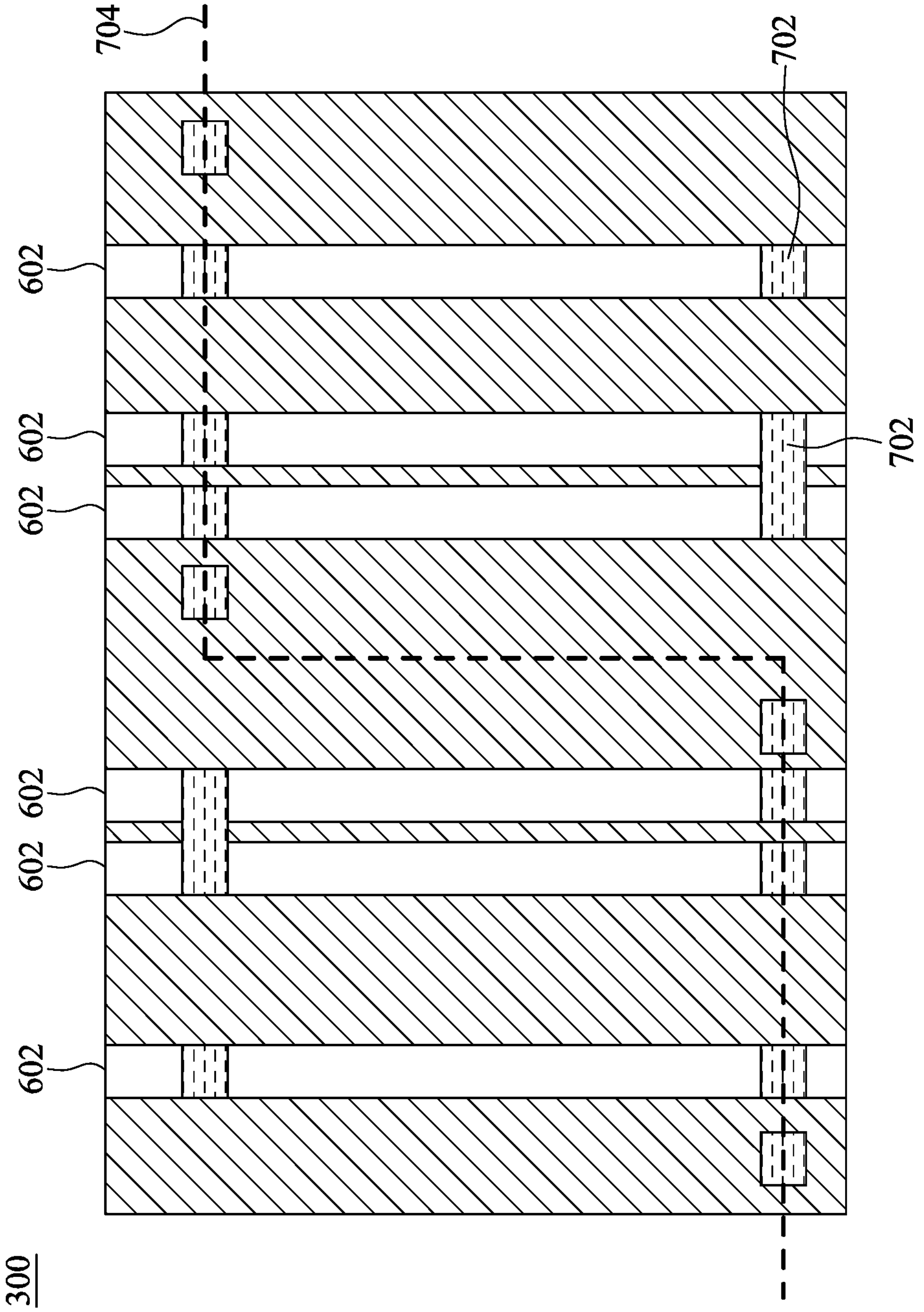

Corresponding to operation 210 of the method 200 of FIG. 2, FIGS. 7A and 7B are top and cross sectional views of the of the semiconductor device 300, wherein source/drain contacts 702 are formed. The source/drain contacts 702 can refer to or be part of the first portion of a via structure 156 of the memory cell 100. For example, the first portion of the via structure 156 can include the electrical contact 702 electrically coupled to the gate layer 306, and to a riser portion of the via structure. Further contacts 702 (e.g., gate contacts) can connect to, for example, the semiconductor channel 602 or the gate oxide 402, and may be or electrically couple to the riser portions described henceforth. As indicated above, the contacts 702 can be formed prior or subsequent to the isolation oxide 504. It is noted that in some embodiments, the contacts 702 may be separated by the gate oxide 402 from a portion of the semiconductor channel 602. The contacts 702 can be formed by depositing a metal layer over a surface of the semiconductor device 300. The deposited metal layer is then patterned using a photolithography process, followed by a selective etching process to remove the unwanted portions of the metal layer and leave the desired pattern of the contacts 702. The contacts 702 can be formed from various materials such as tantalum nitride (TaN), titanium nitride (TiN), tungsten (W), aluminum (Al), polycrystalline silicon (poly-Si), ruthenium (Ru), cobalt (Co), copper (Cu), the like or combinations thereof.

As depicted in FIG. 7B, the cross-sectional view of FIG. 7A can follow the depicted cut line 704. As further depicted in FIG. 7B, the contacts 702 can electrically couple multiple semiconductor channels 602 to each other. For example, the contacts 702 can be or include the various drain/source connections depicted in FIG. 1. Various cross sectional views can follow various cut lines.

Figure 8A:
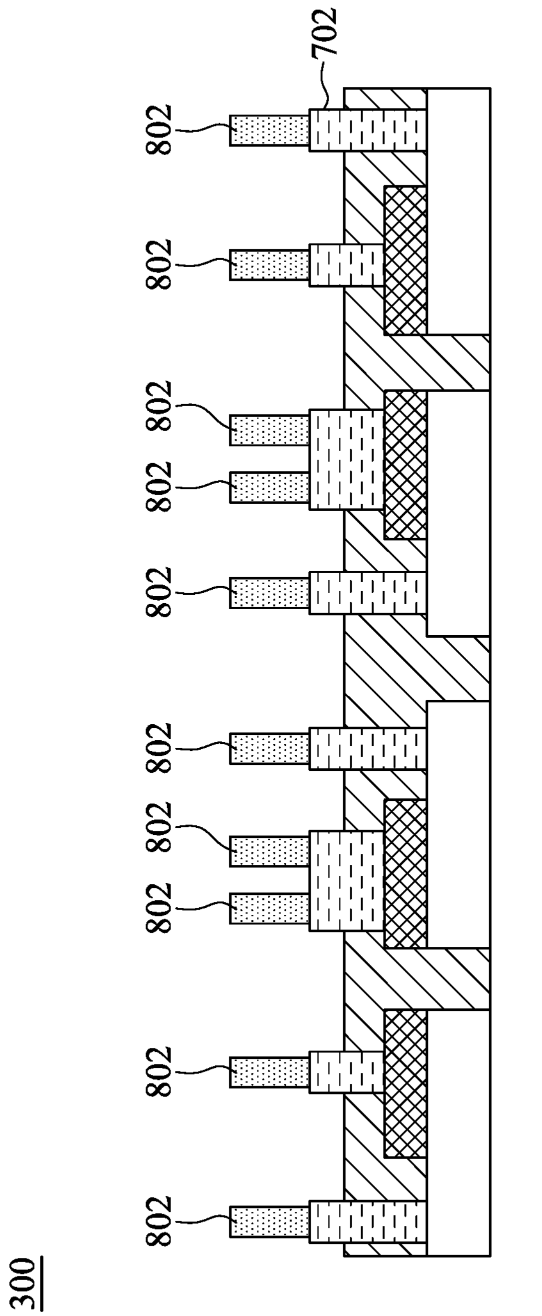
Figure 8B:
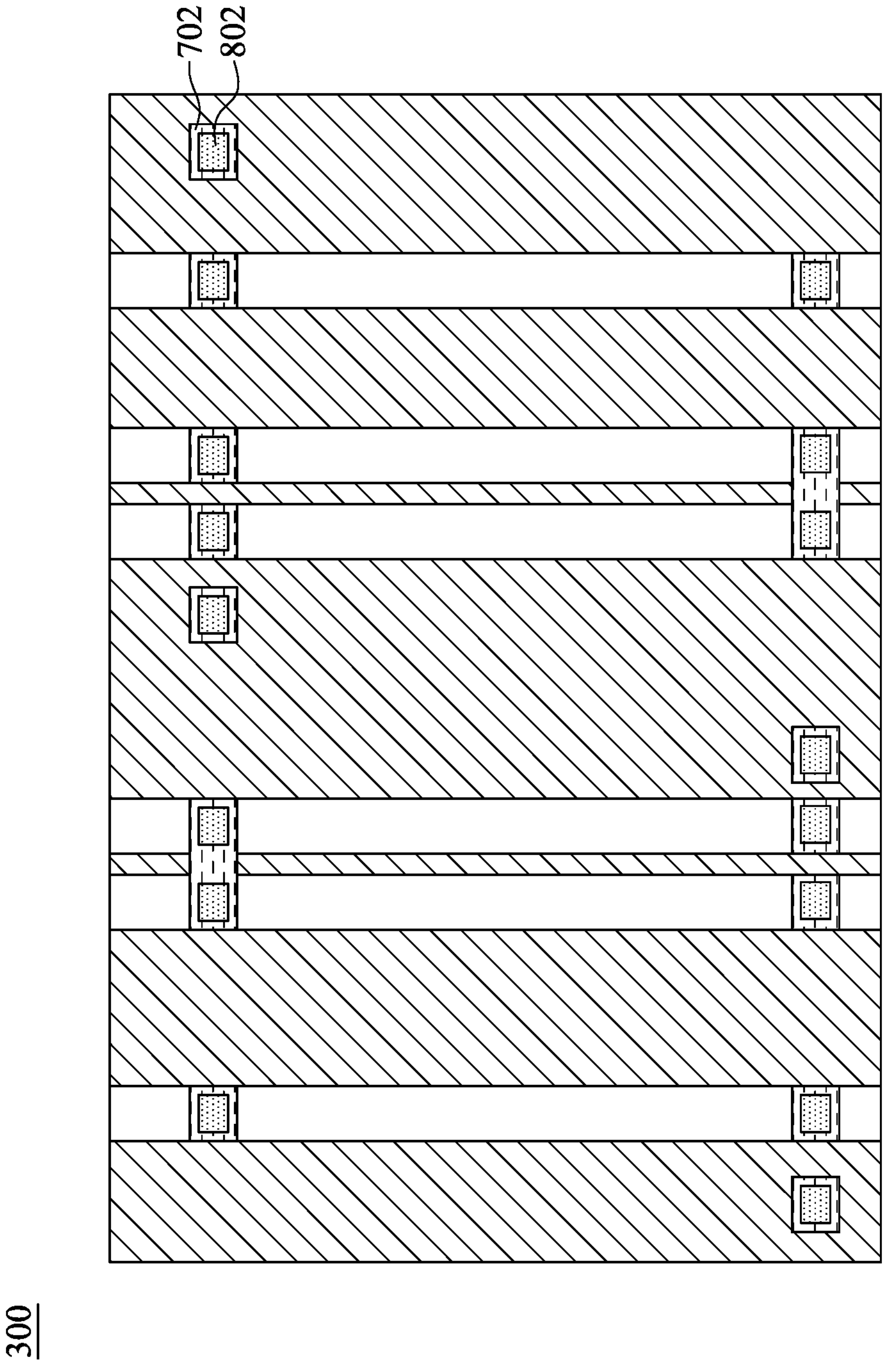

With continued correspondence to operation 210 of the method 200 of FIG. 2, FIGS. 8A and 8B are top and cross sectional views of the of the semiconductor device 300, wherein a first riser portion 802 of the first portion of the via structure 156 is formed over the contacts 702. Merely for clarity and brevity of depiction, dielectric material (e.g., ILD) to isolate the conductive interconnects such as the via structures is omitted in the figure, and other figures henceforth.

It is noted that such a material can be formed to fill the vertically disposed layers for the via structures 156 and mezzanine levels. For example, a conductive layer such as the layer comprising the first riser portion 802 is deposited over a surface of the semiconductor device 300. A dielectric layer (not depicted) is deposited on top of the contacts 702, gate layer 306, or gate oxide 402 using a suitable deposition technique, such as chemical vapor deposition or spin-coating. The dielectric layer is then planarized using a chemical-mechanical polishing or grinding (CMP/G) or another suitable process to remove any excess material and create a smooth and uniform surface. The planarized dielectric layer is then etched using a suitable etching technique to create openings that expose the underlying contacts 702, gate layer 306, or gate oxide 402. The openings are then filled with a suitable conductive material, such as copper or tungsten, using a deposition process such as electroplating or chemical vapor deposition, to provide a conductive pathway between the contacts 702, gate layer 306, or gate oxide 402, and first mezzanine level of the semiconductor device 300, discussed henceforth.

Figure 9A:
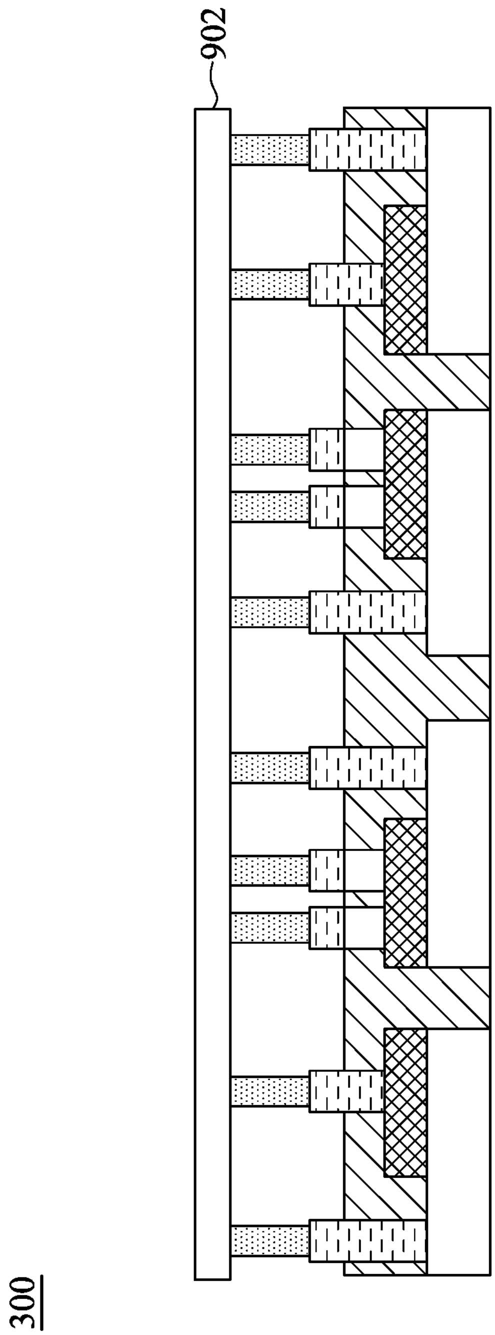
Figure 9B:
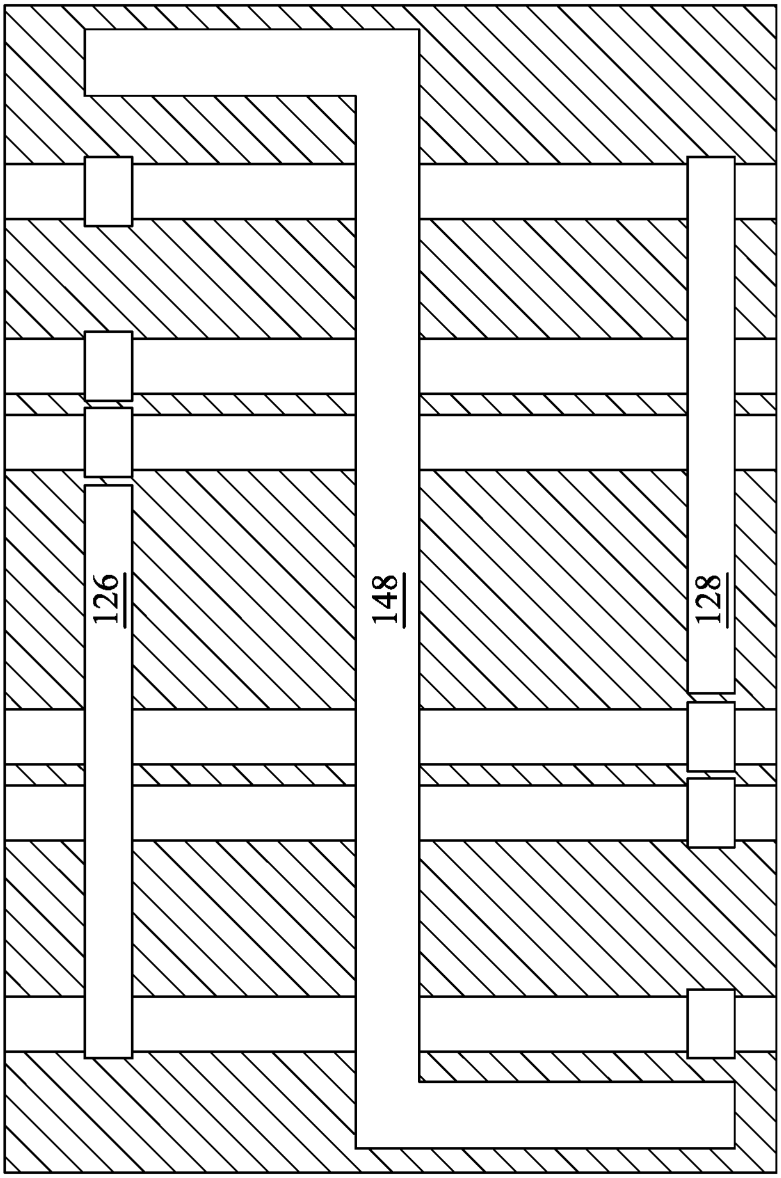

Corresponding to operation 212 of the method 200 of FIG. 2, FIGS. 9A and 9B are top and cross sectional views of a semiconductor device 300, wherein a first mezzanine level 902 is formed over a surface thereof. For example, the first mezzanine level 902 can include various interconnections which can correspond to portions of the circuit depicted in FIG. 12. Particularly, the first mezzanine level 902 can include a word line 148, storage node (Q) 126, complimentary storage node (QB) 128, and conductive elements to electrically couple to the first riser portion 802. The mezzanine level 902 may be formed according to similar method as other metallization layers 304, such as the riser portion 802. For example, the mezzanine level 902 can be formed by depositing a metal layer over a surface of the semiconductor device 300. The deposited metal layer is then patterned using a photolithography process, followed by a selective etching process to remove the unwanted portions of the metal layer and leave the desired pattern of the mezzanine level 902.

Figure 10A:
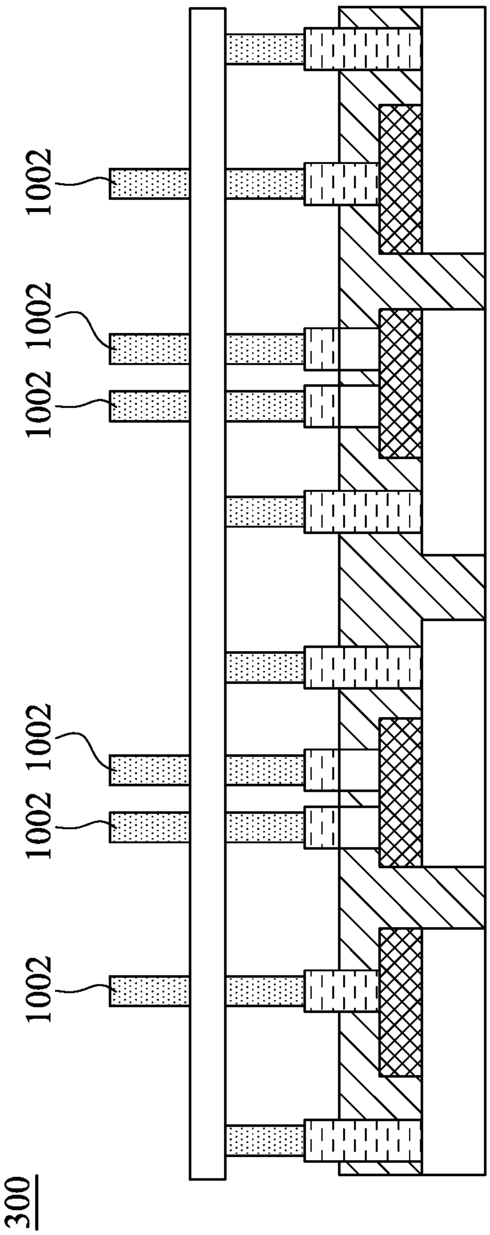
Figure 10B:
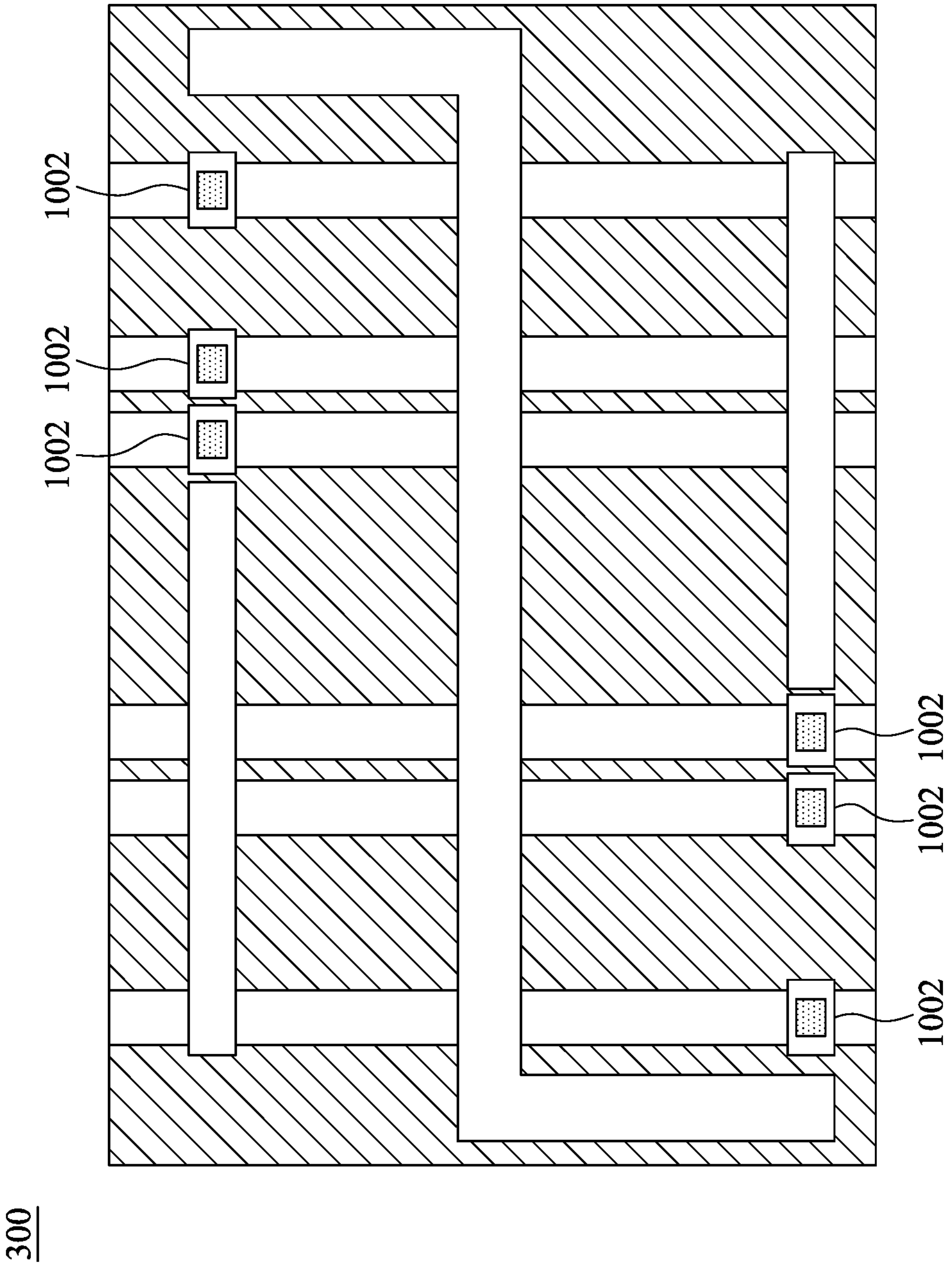

Corresponding to operation 214 of the method 200 of FIG. 2, FIGS. 10A and 10B are top and cross sectional views of the semiconductor device 300, wherein a second riser portion 1002 of the first portion of the via structure 156 is formed. The second riser portion 1002 can be formed according to the same techniques discussed with regard to the first riser portion at FIGS. 8A and 8B. Likewise, any number of alternating additional mezzanine levels and riser portions can be formed in a similar fashion.

Figure 11A:
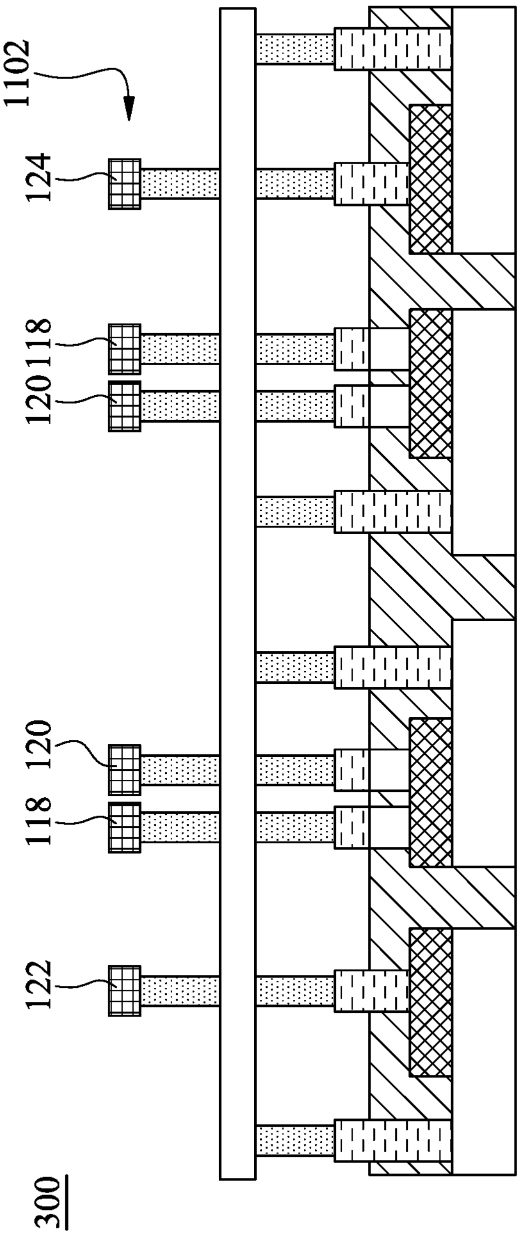
Figure 11B:
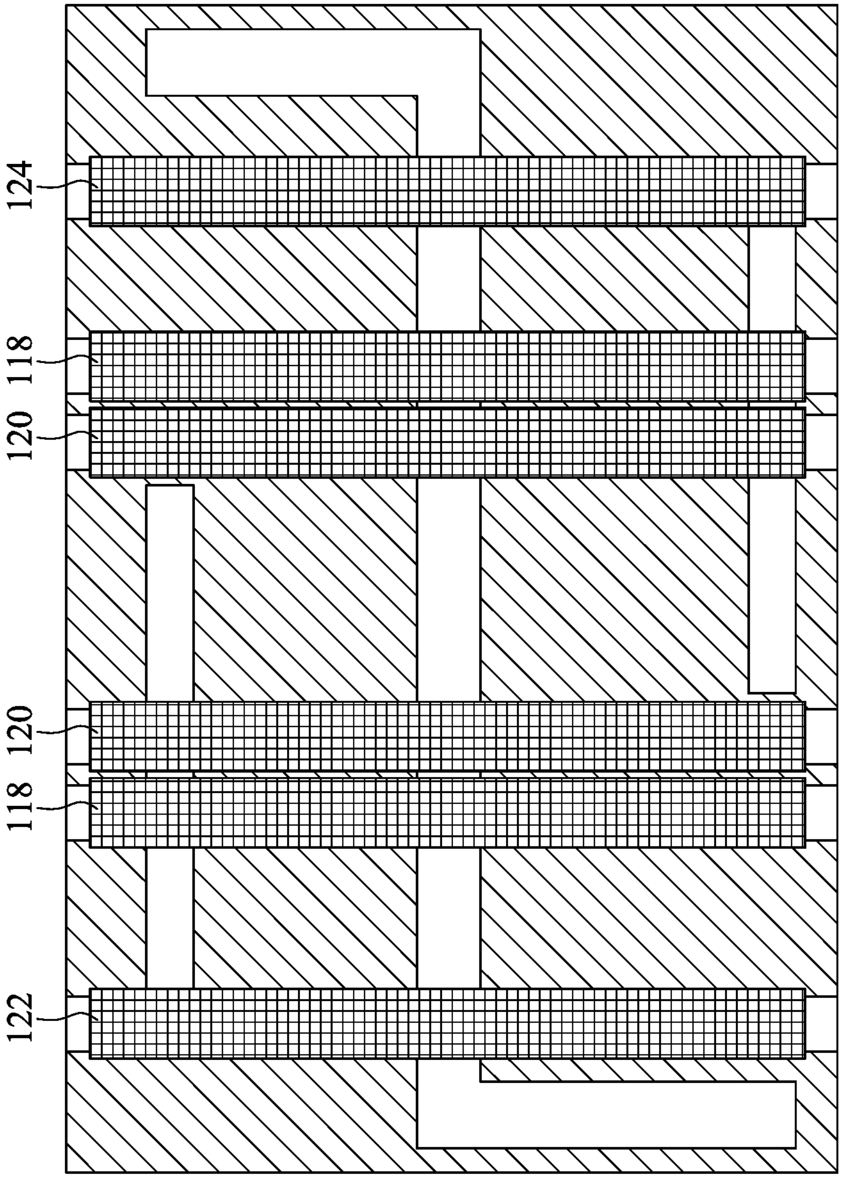

Corresponding to operation 216 of the method 200 of FIG. 2, FIGS. 11A and 11B are top and cross sectional views of semiconductor device 300, wherein a second mezzanine level 1102 is formed over a surface thereof. The second mezzanine level 1102 can include various interconnections which can correspond to portions of the circuit depicted on FIG. 12. Particularly, the first mezzanine level 902 can include the first voltage level 118, second voltage level 120, first bit line 122, and second bit line 124. The various voltage levels (e.g., for pull up or pull down transistors) can connect to further layers or portions of the semiconductor device 300 such as a redistribution layer for a ground plane or VCC level. The second mezzanine level 1102 can extend conductive portions thereof to one or more I/O regions for various memory cells. The various I/O can connect between layers of the semiconductor device 300, such as to an active surface of a semiconductor die. For example, the depicted bit lines 122, 124 can connect to the die directly or through a data bus arbitration line (not depicted).

Figure 12:
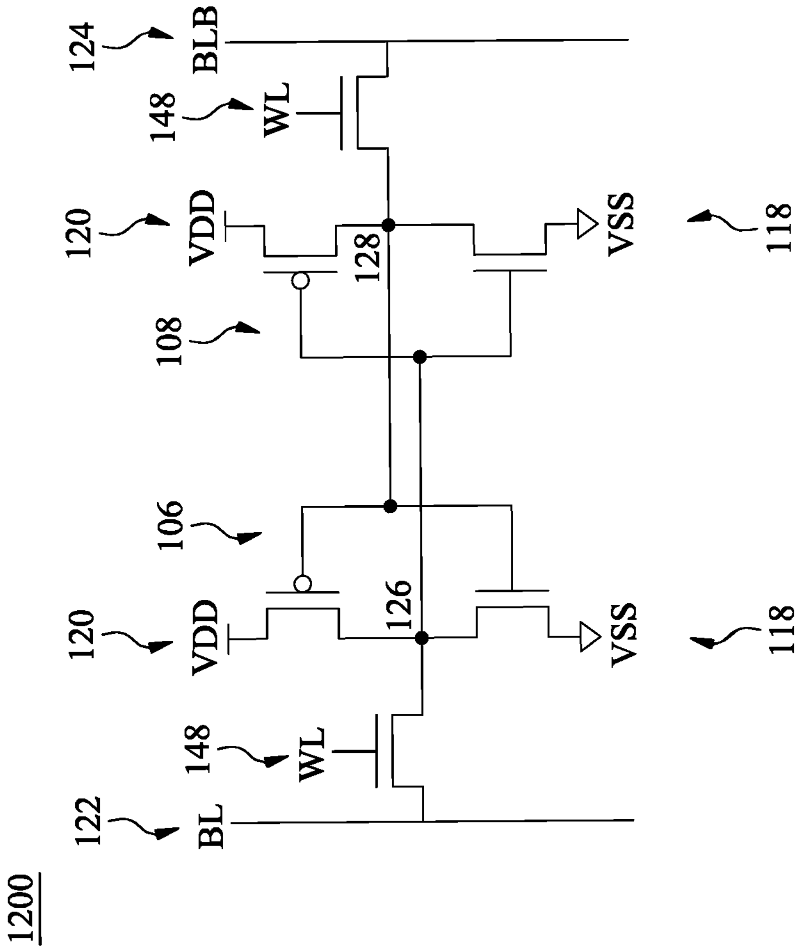
FIG. 12 illustrates a circuit corresponding to a 6 T SRAM memory cell of a semiconductor device, in accordance with some embodiments.

Referring now to FIG. 12, a schematic diagram 1200 for a circuit corresponding to a 6 T SRAM memory cell of a semiconductor device 300 is provided, in accordance with some embodiments. The schematic diagram 1200 includes a first inverter 106 cross-coupled with a second inverter 108. Each of the first inverter 106 and the second inverter 108 includes a pull-up/pull-down transistor pair to each of a respective first voltage 118, depicted as VSS, and second voltage 120, depicted as VDD. A word line 148 selectively connects the respective inverters 106, 108 to each of a first bit line 122 and a second bit line 124.

Figure 13:
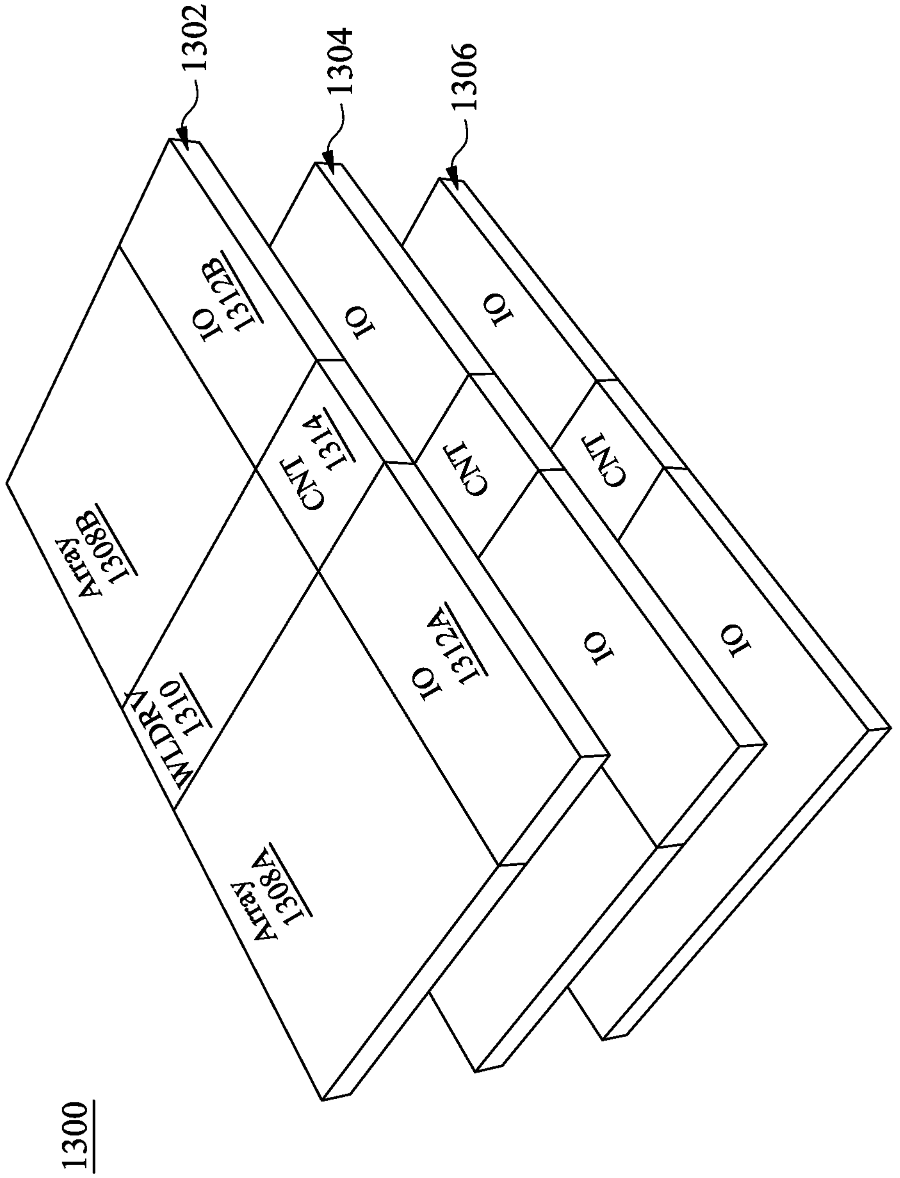
FIG. 13 illustrates a block diagram for a semiconductor device, in accordance with some embodiments.

Referring now to FIG. 13, a block diagram 1300 for a semiconductor device 300 is provided, in accordance with some embodiments. The block diagram 1300 includes a first memory sub-stack 1302, a second memory sub-stack 1304, and a third memory sub-stack 1306. Each sub-stack can include one or more layers, such as the layers depicted corresponding to FIG. 11A, FIG. 23B, or FIG. 23C.

Each sub-stack 1302 can include one or more arrays 1308, such as the depicted first memory array 1308A and second memory array 1308B. A memory controller 1314 can cause word line drivers 1310 to select various rows of memory cells 100 for read or write operations, and convey information to the cells via an I/O block 1312. For example, a first I/O block 1312A can correspond to the first memory array 1308A and the second I/O block 1312B can correspond to the second memory array 1308B.

Each of the arrays 1308 can include one or more cell types. For example, the first memory array 1308A and second memory array 1308B can be a same or different memory cell type, and can further be a same or different memory cell type relative to memory arrays 1308 of the second sub-stack 1304 or third sub-stack 1306. For example, channel dimensions, gate oxide thicknesses or materials, and the like may be varied to generate memory cells having various conditions (e.g., power optimized for low-leakage high-access time or performance optimized for high-leakage low-access time, etc.).

Figure 14:
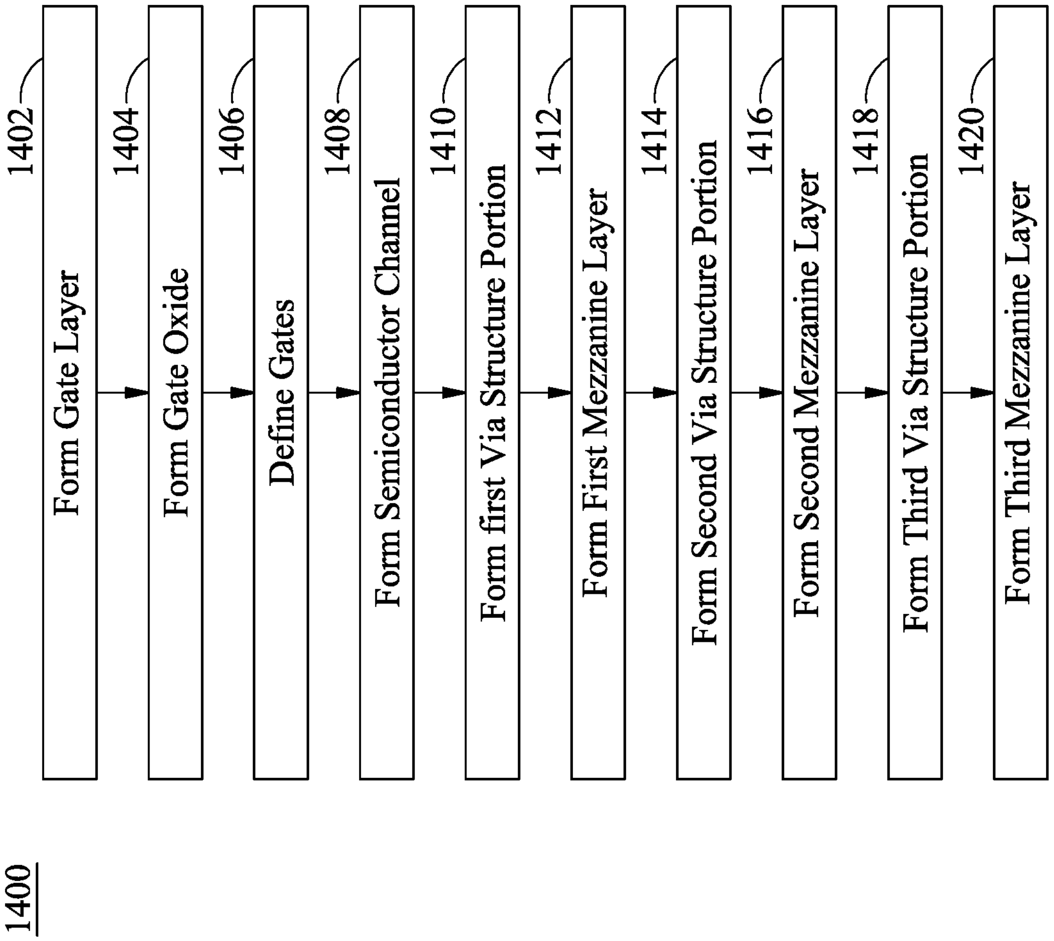
FIG. 14 is another example flow chart of a method for fabricating a semiconductor device, in accordance with some embodiments.

FIG. 14 is another example flow chart of a method 1400 for fabricating a semiconductor device 300, in accordance with some embodiments. For example, at least some of the operations described in the method 1400 may result in an 8 T SRAM memory cell 100 depicted FIGS. 14-23C, corresponding to a schematic diagram 2400 of FIG. 24. The disclosed method 1400 is disclosed as a non-limiting example, and additional operations may be provided before, during, and after the method 1400 of FIG. 14. Further, some operations may only be described briefly herein, however, one skilled in the art will understand that the disclosed operations may be performed in conjunction with other disclosed methods disclosed herein, or generally known in the art. Further, the order of the disclosed operations is not intended to be limiting; certain operations may be performed in a different sequence, and still further operations may be sequenced with appropriate modifications thereto.

In brief summary, the method 1400 includes operation 1402, of forming a gate layer of the semiconductor device 300. The method 1400 further includes operation 1404, wherein a gate oxide is formed over the gate layer. The method 1400 further includes operation 1406, wherein various gates are defined from the gate layer. The method 1400 further includes operation 1408, wherein various semiconductor channels are formed. At operation 1410, a first via structure portion is formed. The via structure portion can include a source/drain connection or a riser portion of a via. At operation 1412, a first mezzanine level is formed. At operation 1414, a second riser portion of a second via structure portion is formed. At operation 1416, a second mezzanine level is formed. At operation 1418, a third riser portion of a third via structure portion is formed. At operation 1420, a third mezzanine level is formed.

Figure 15:
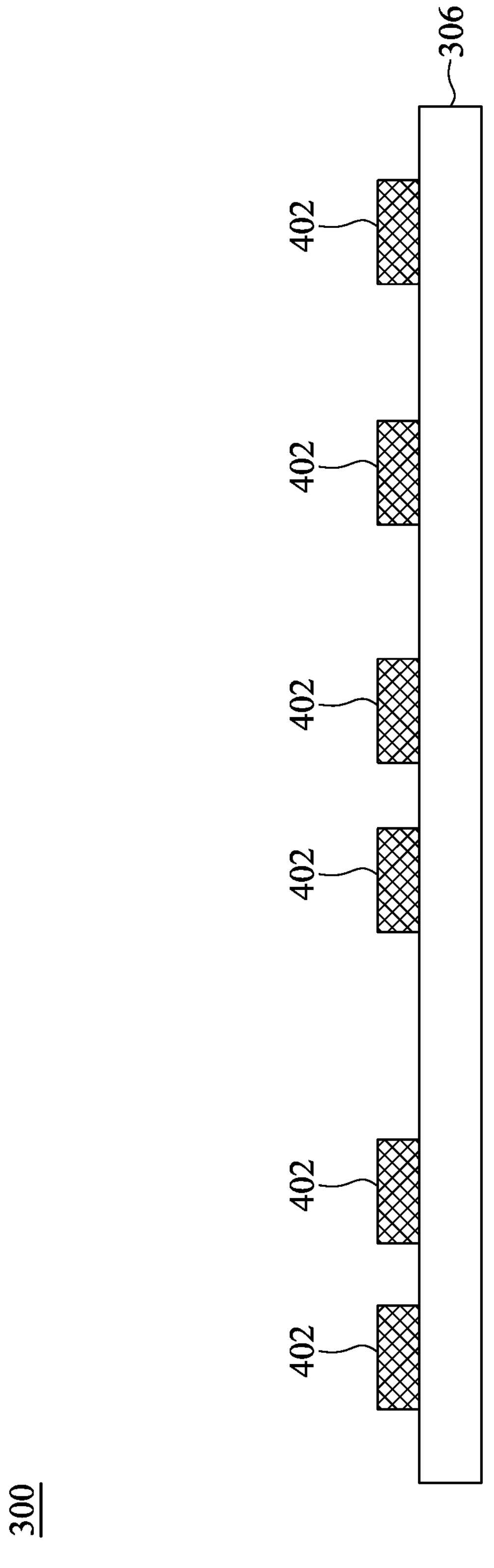
FIGS. 15, 16, 17A, 17B, 18A, 18B, 19A, 19B, 20A, 20B, 21A, 21B, 22A, 22B, 23A, 23B, and 23C illustrate top and cross-sectional views of an example semiconductor device during various fabrication stages, made by the method of FIG. 14, in accordance with some embodiments.
Figure 16:
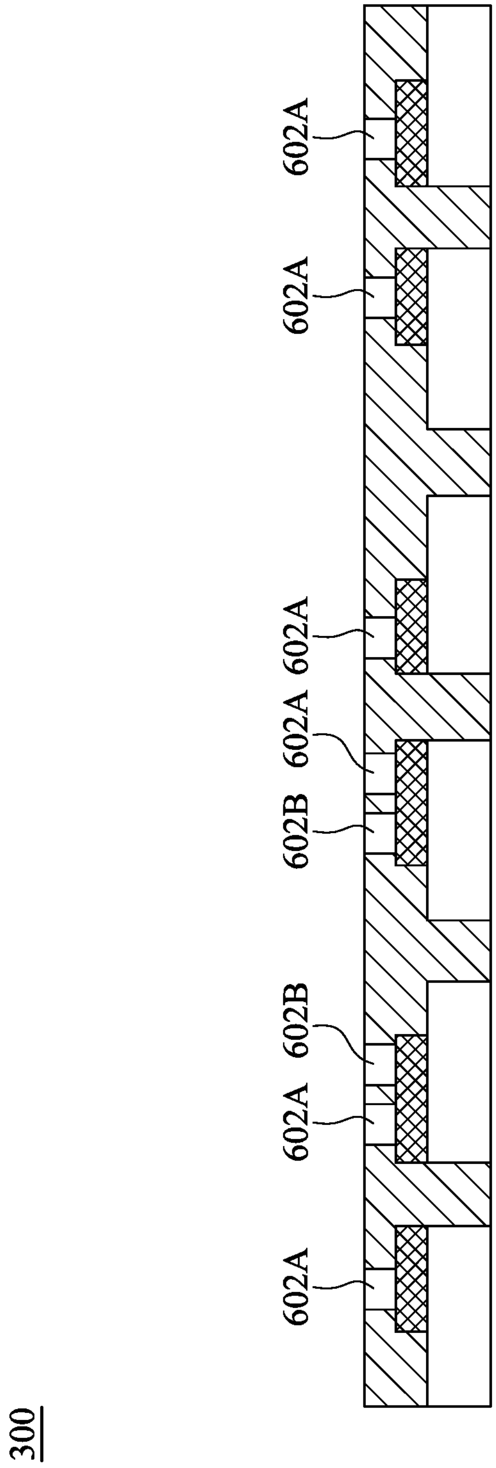

Some operations of the disclosed method 1400 may be similar to operations of the method 200 of FIG. 2, and detailed descriptions of the corresponding to these operations are not repeated. However, further figures are included to disclose an example 8T memory cell. The example is illustrative and is not intended to be limiting, various routings of the interconnections can be formed according to various embodiments, and further memory cells (e.g., 9 T cells or 10 T cells) can be formed according to the present disclosure. Operation 1402 corresponds to operation 202 of FIG. 2. Operation 1404 corresponds to operation 204 of FIG. 2. In the depicted example, further gate oxide 402 can be formed over the gate layer 306, corresponding to the further transistors of the 8 T memory cell 100, as depicted in FIG. 15. Operation 1406 corresponds to operation 206 of FIG. 2. Operation 1408 corresponds to operation 208 of FIG. 2. In the depicted example, further semiconductor channels 602 (e.g., n-type channels 602A and p-type channels 602B) can be formed over the gate oxide 402. Once again, the example depicted in FIG. 16 is not intended to be limiting. In various embodiments, 8 T SRAM memory cells 100 can include: two n-type channels 602A for a read port, along with four further n-type channels 602A, and two p-type channels 602B; two p-type channels 602B for a read port, along with four further p-type channels 602B, and two n-type channels 602A; two n-type channels 602A or p-type channels 602B for a read port, along with two channels of the same type and four channels of the other of the n-type channels 602A or p-type channels 602B.

Figure 17A:
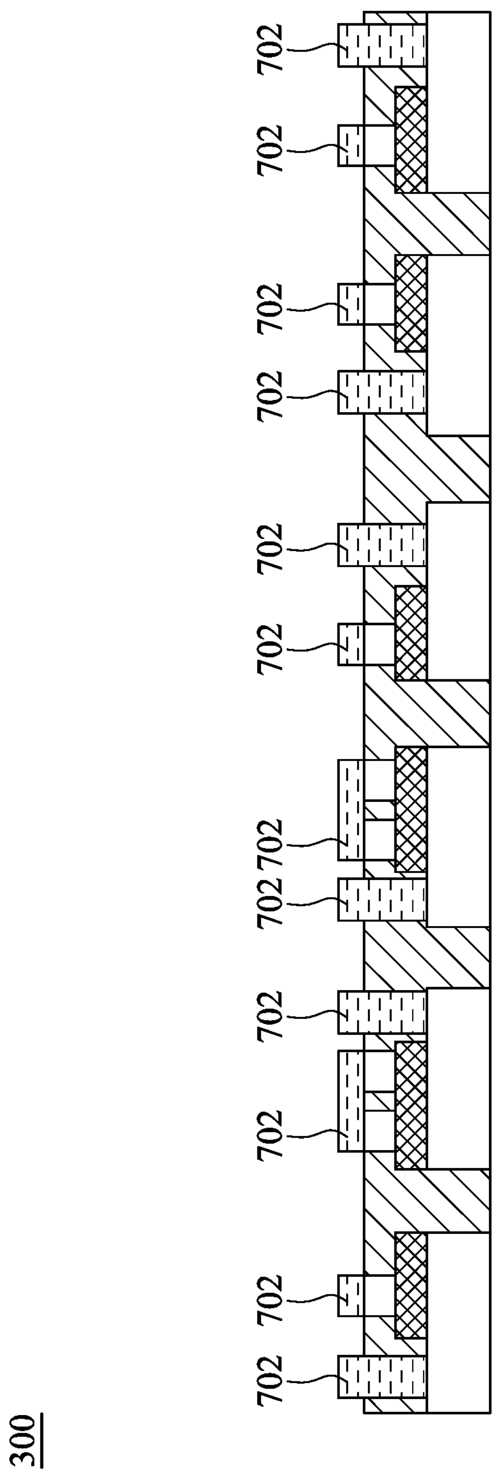
Figure 17B:
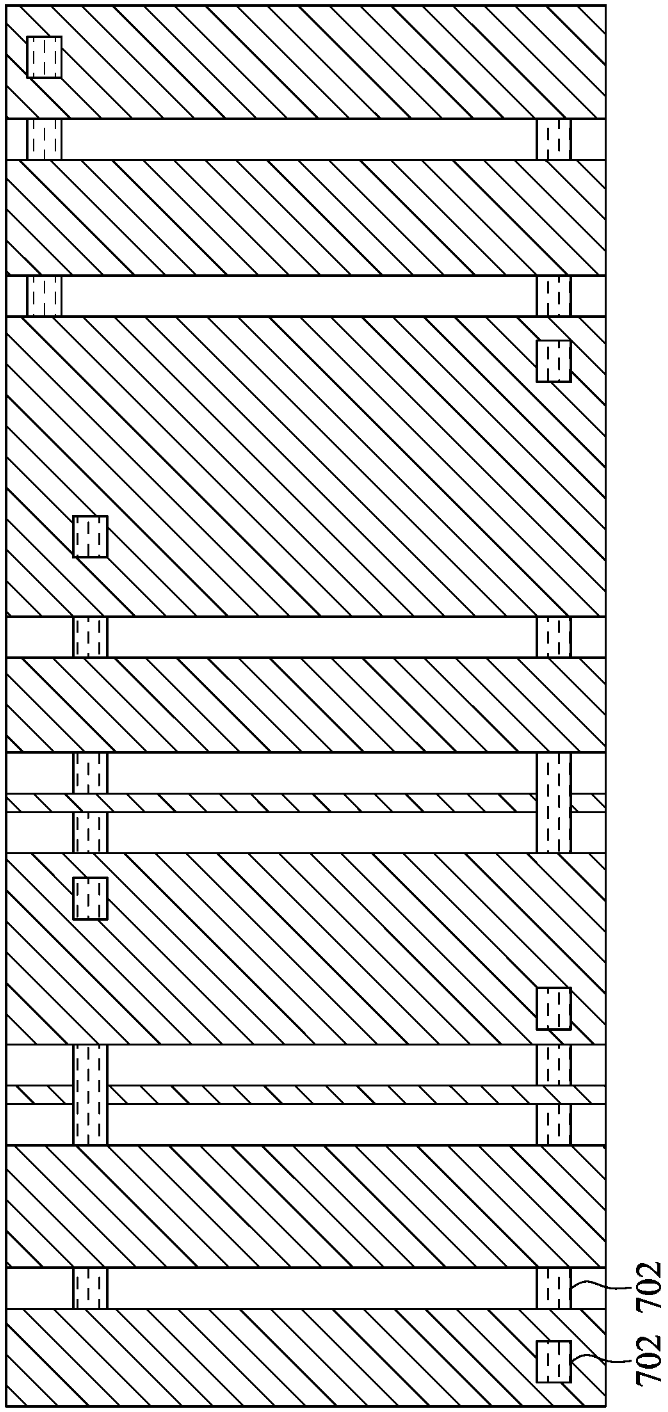
Figure 18A:
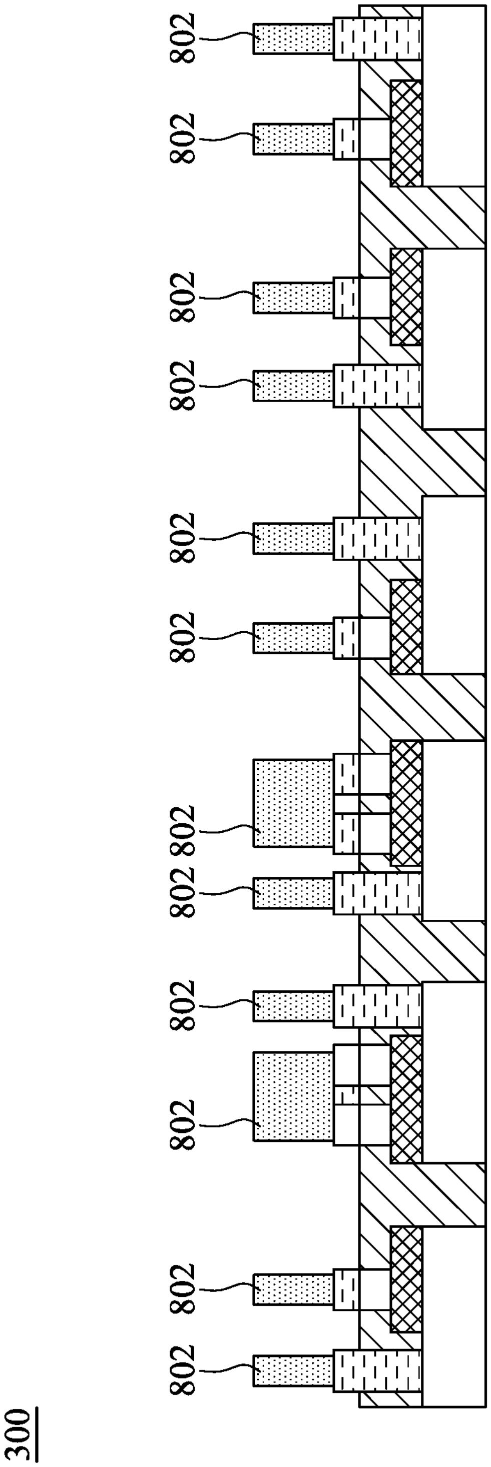
Figure 18B:
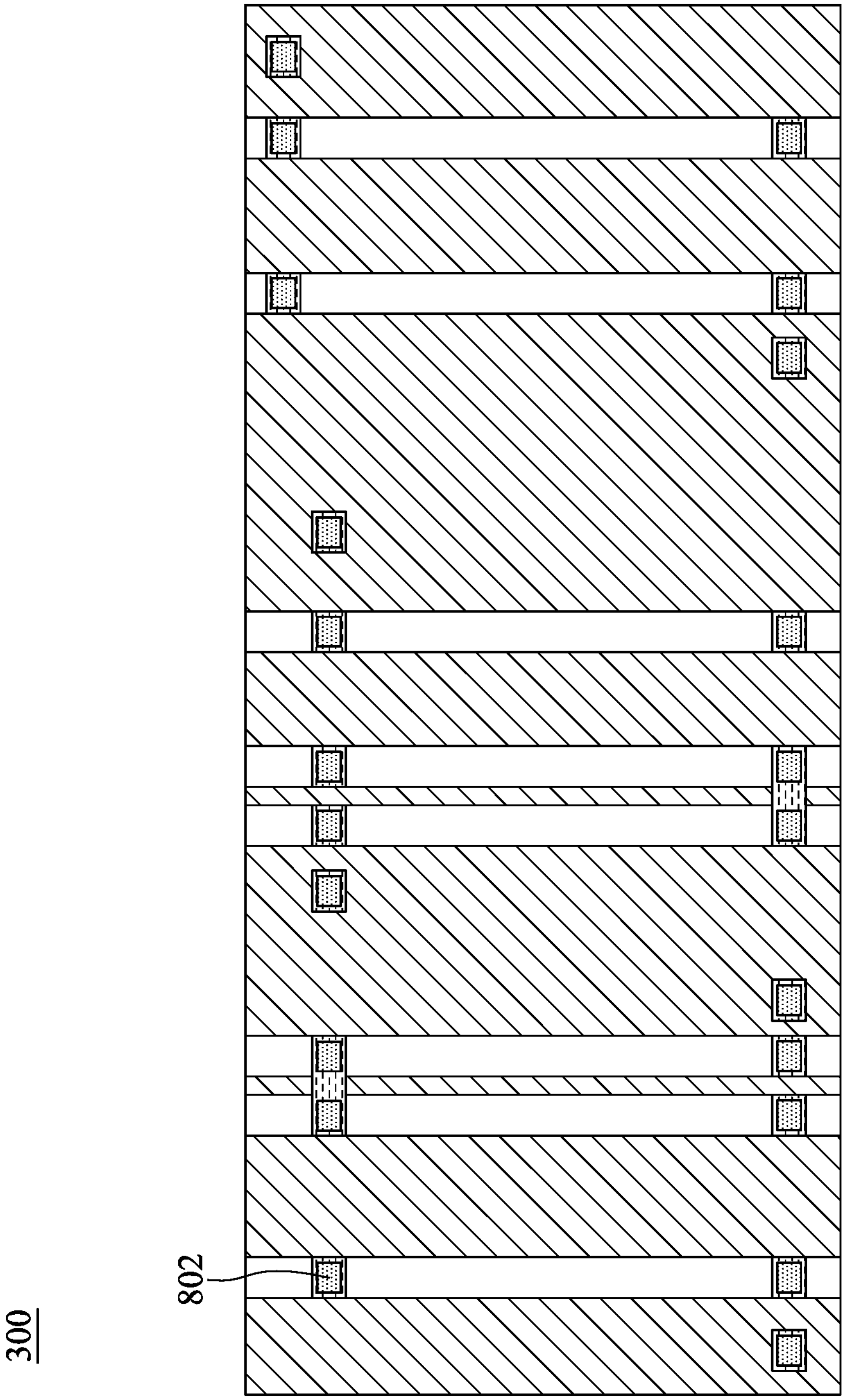
Figure 19A:
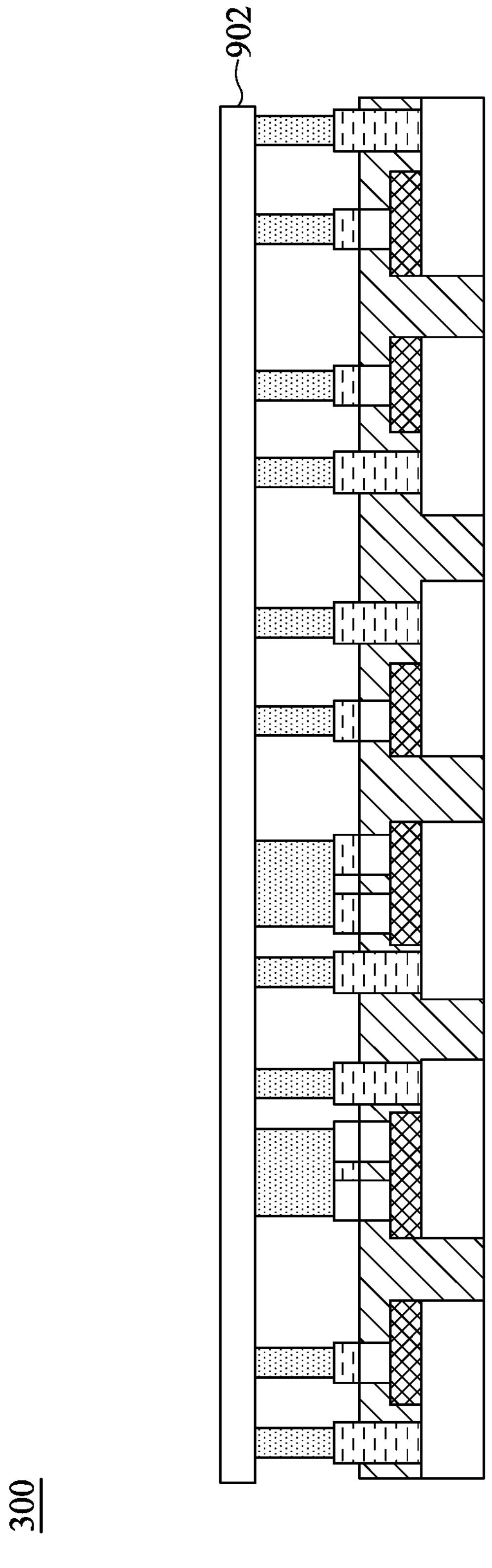
Figure 19B:
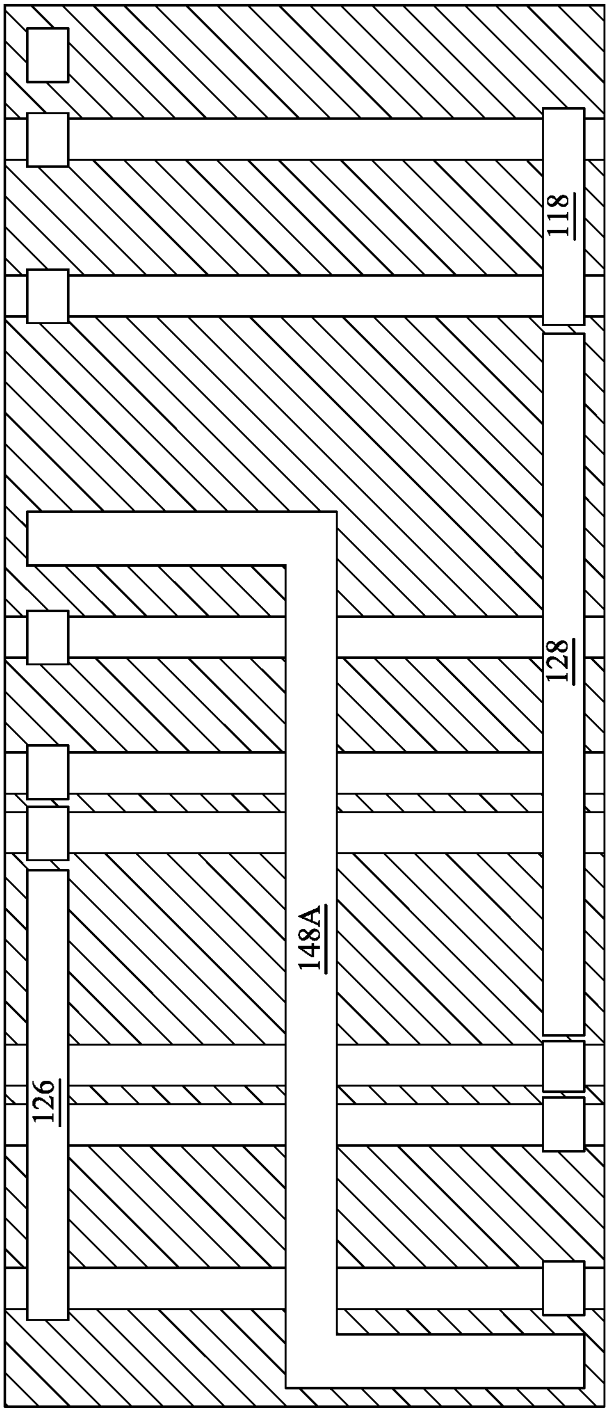
Figure 20A:
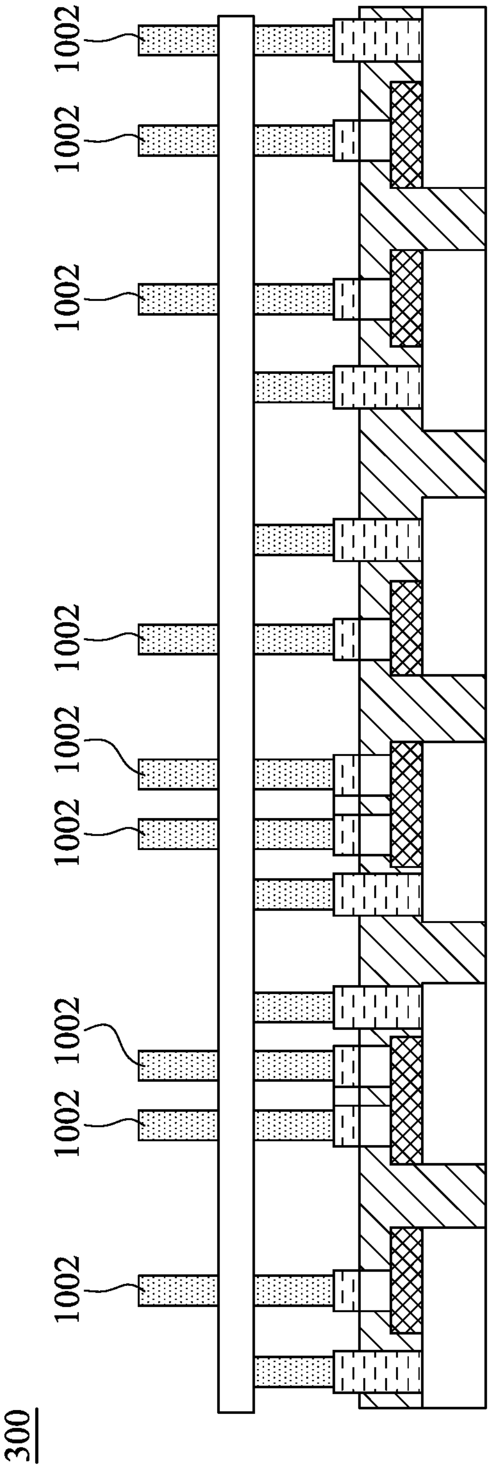
Figure 20B:
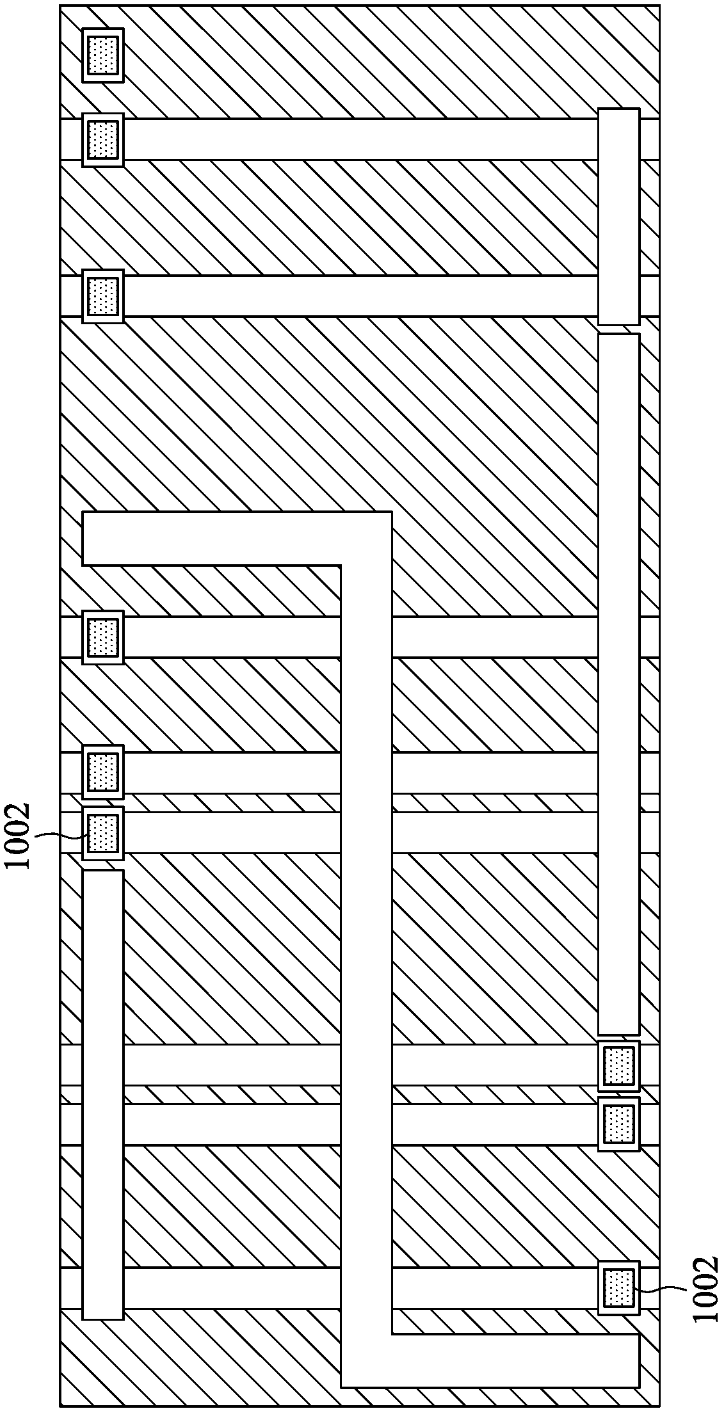
Figure 21A:
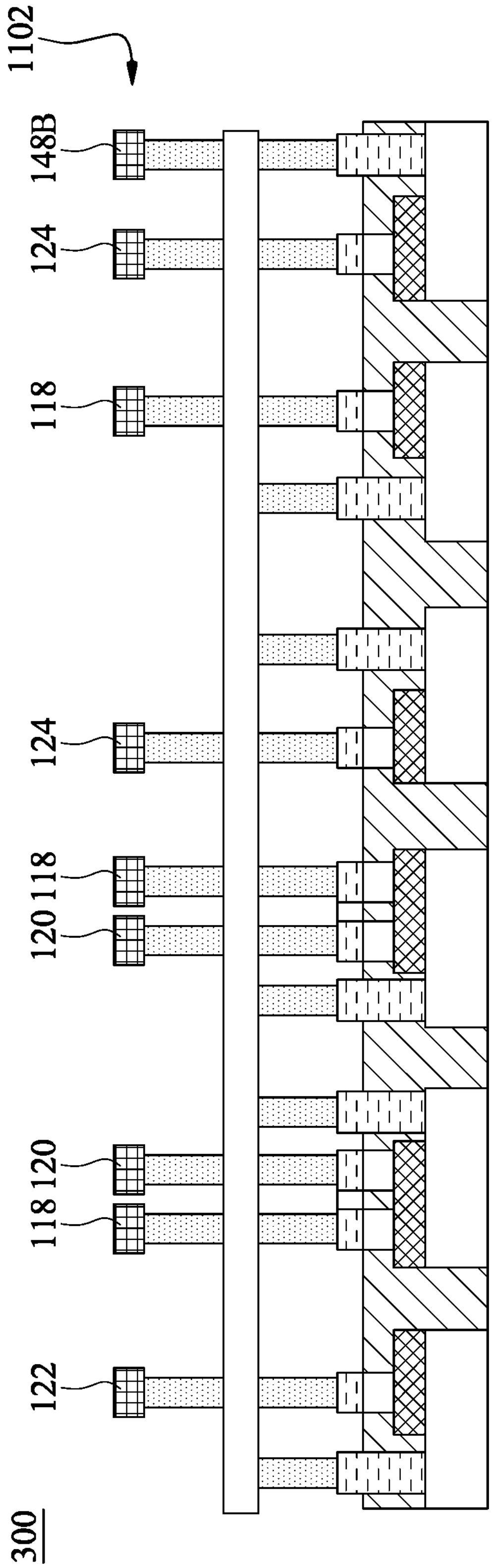
Figure 21B:
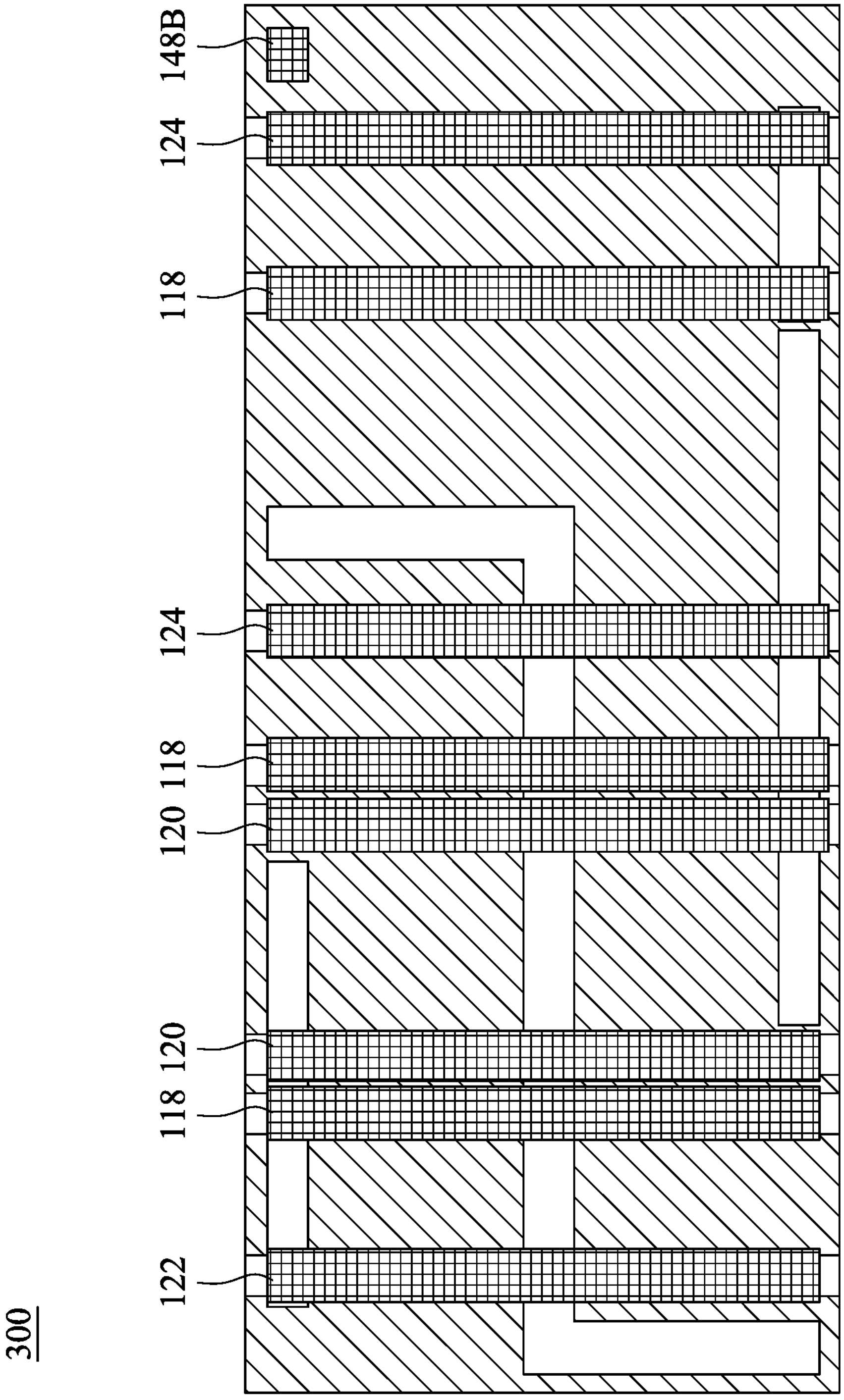

Operation 1410 corresponds to operation 210 of FIG. 2. FIGS. 17A and 17B depict cross sectional and top views, respectively, of a semiconductor device 300 including contacts 702 (source/drain contacts 702) electrically coupled to the semiconductor channels. With further correspondence to operation 1410, FIGS. 18A and 18B depict first riser portions 802 formed over the contacts 702. Operation 1412 corresponds to operation 212 of FIG. 2. As depicted, in FIGS. 19A and 19B, the first mezzanine level 902 includes a write word line 148A, first bit line 122, second bit line 124, and voltage level line, such as the depicted first voltage level 118 (e.g., VSS). Operation 1414 corresponds to operation 214 of FIG. 2, as depicted in FIGS. 20A and 20B. Operation 1416 corresponds to operation 216 of FIG. 2. The second mezzanine level 1102 is depicted in the cross sectional view of FIG. 21A and the top view of FIG. 21B. As depicted, the second mezzanine level 1102 includes a first voltage level 118 and second voltage level 120, first bit line 122 and second bit line 124. A further word line 148 (e.g., the depicted read word line 148B) extends from the gate layer 306, through an electrically coupled via structure 156 (e.g., comprising a contact 702, first riser portion 802, first mezzanine level 902, second riser portion 1002, and second mezzanine level 1102).

Figure 22A:
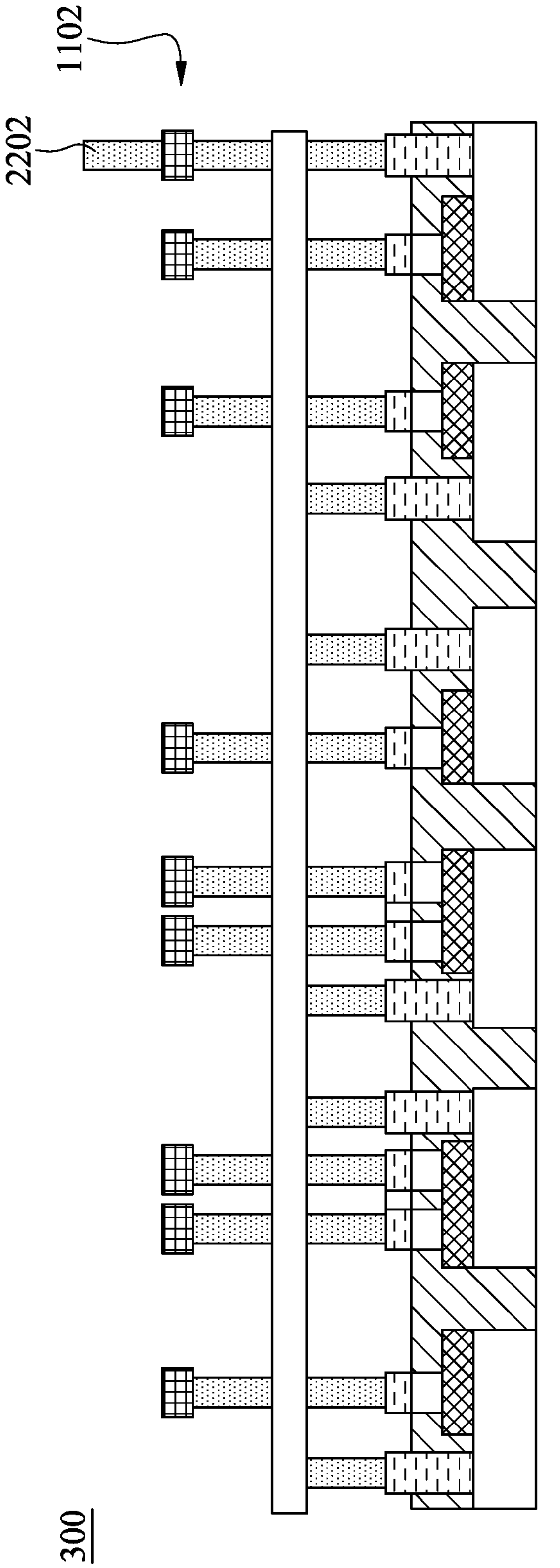
Figure 22B:
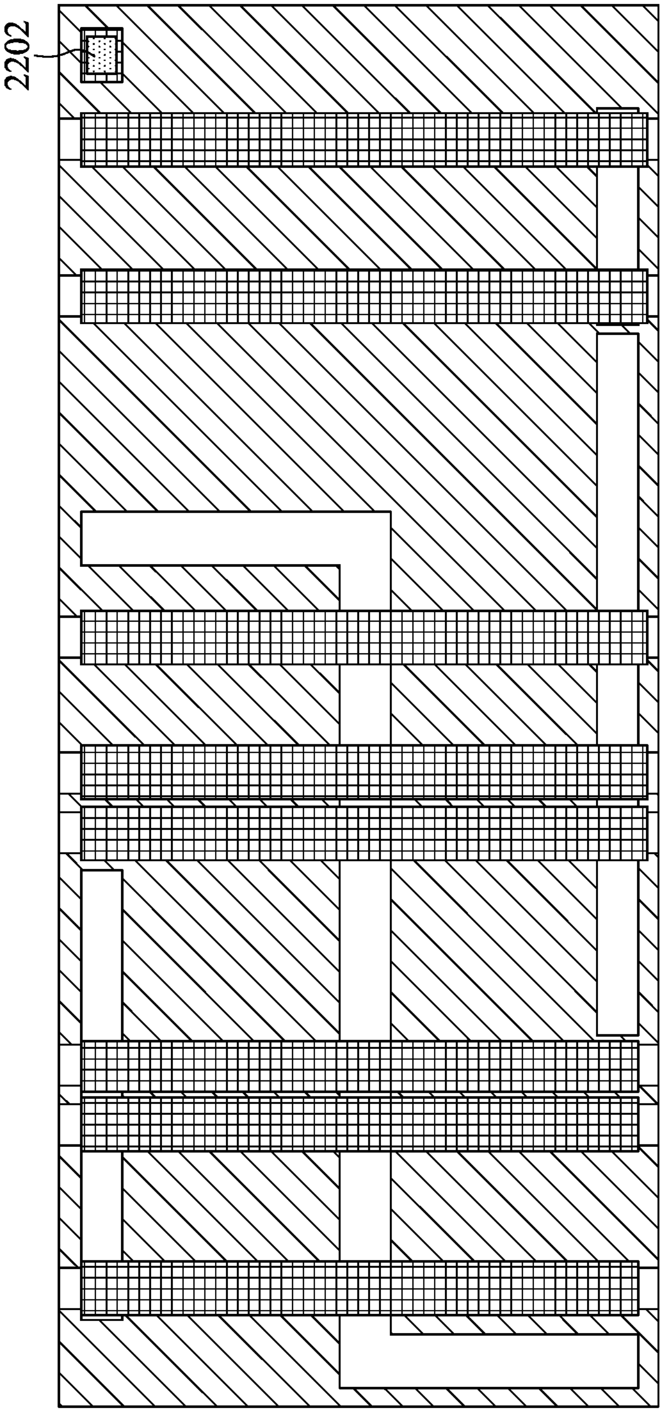

Corresponding to operation 1418 of the method 1400 of FIG. 14, FIGS. 22A and 22B are top and cross sectional view of the semiconductor device 300, wherein a third riser portion 2202 of the first portion of the via structure 156 is formed. The third riser portion 2202 can be formed according to the same techniques discussed with regard to the second riser portion 1002 or the first riser portion 802.

Figure 23A:
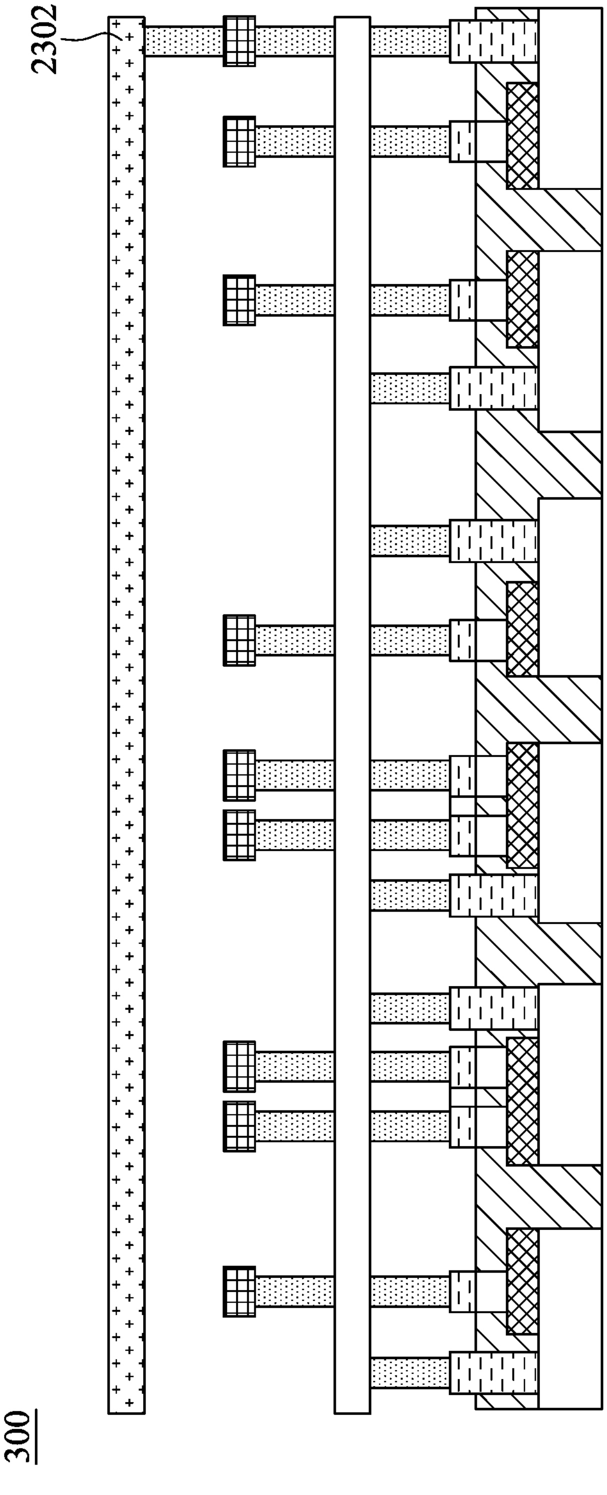
Figure 23B:
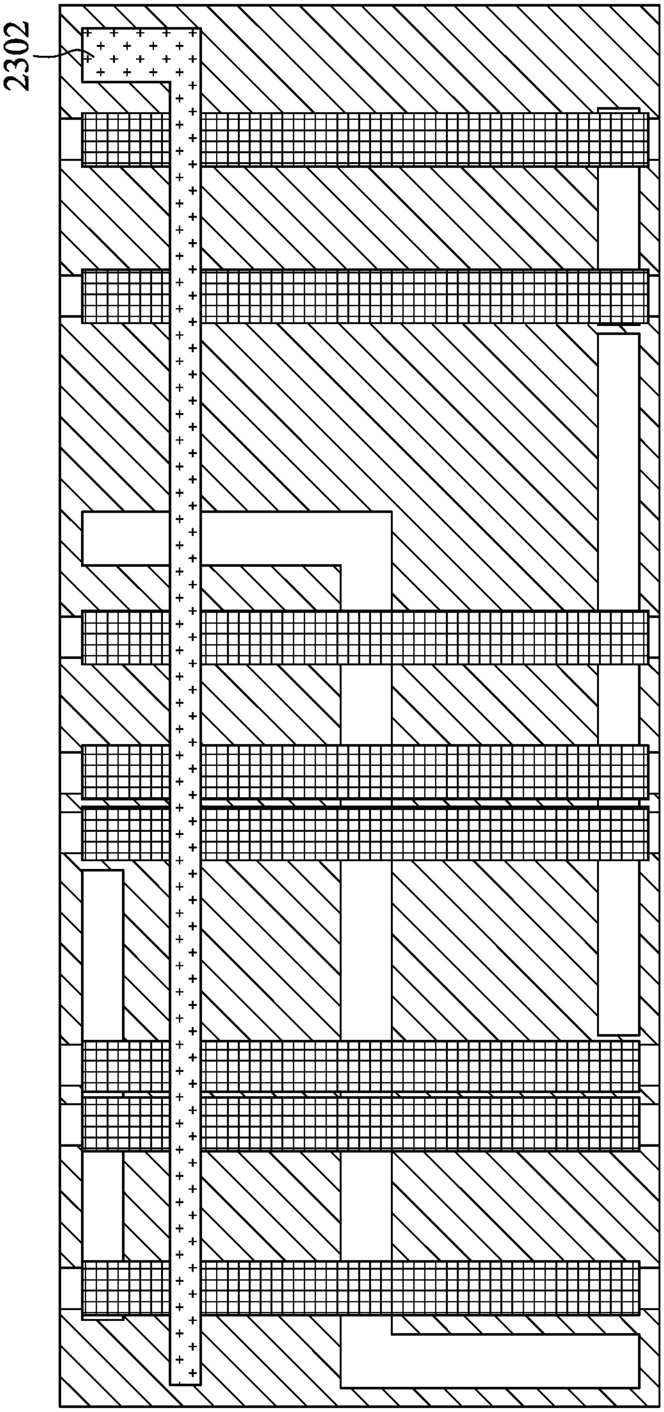
Figure 23C:
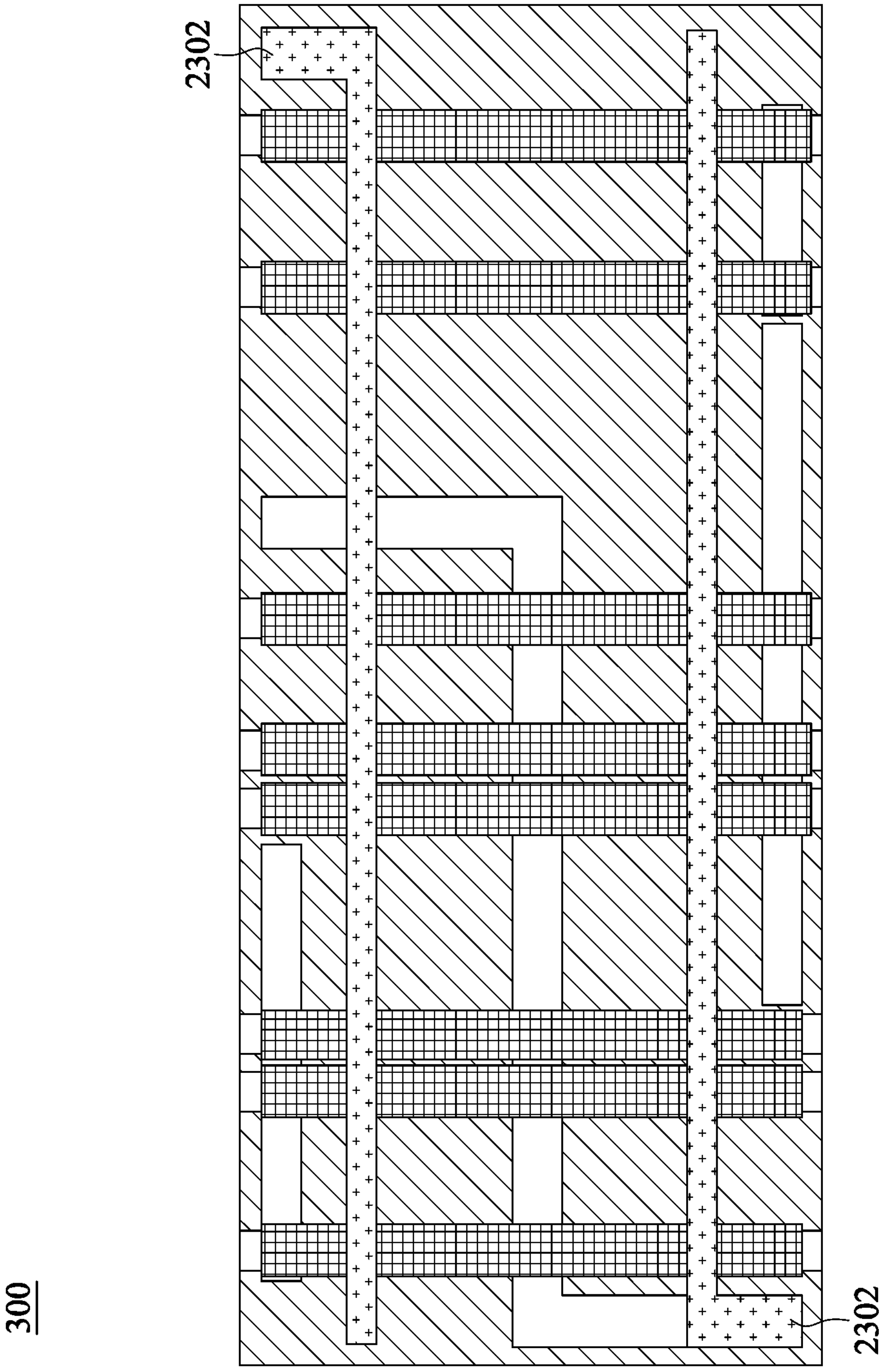

Corresponding to operation 1420 of the method 1400 of FIG. 14, FIGS. 23A and 23B are top and cross sectional view of the semiconductor device 300, wherein a third mezzanine level 2302 is formed. The third mezzanine level 2302 can include various interconnections which can correspond to portions of the circuit depicted on FIG. 24. For example, the third mezzanine level 2302 can include a lateral portion of the read word line 148B. As noted above, the semiconductor device 300 can include a second gate layer 308, third gate layer 310 and so forth, disposed vertically spaced along the semiconductor device 300. In some embodiments, the various memory cells 100 comprising gates on the various gate layers (e.g., the second gate layer 308) can include portions disposed on a same semiconductor layer. For example, FIG. 23C depicts the memory cell 100 of FIG. 22B, along with a further read word line 148B, which may be a read word line 148B for another memory cell. For example, stacked memory cells 100 can alternate between having a read word line 148B (or other interconnect) disposed over a gate layer thereof, and under a gate layer thereof, which may increase device density, lower resistive losses for signals traversing the semiconductor device 300, and so forth.

Figure 24:
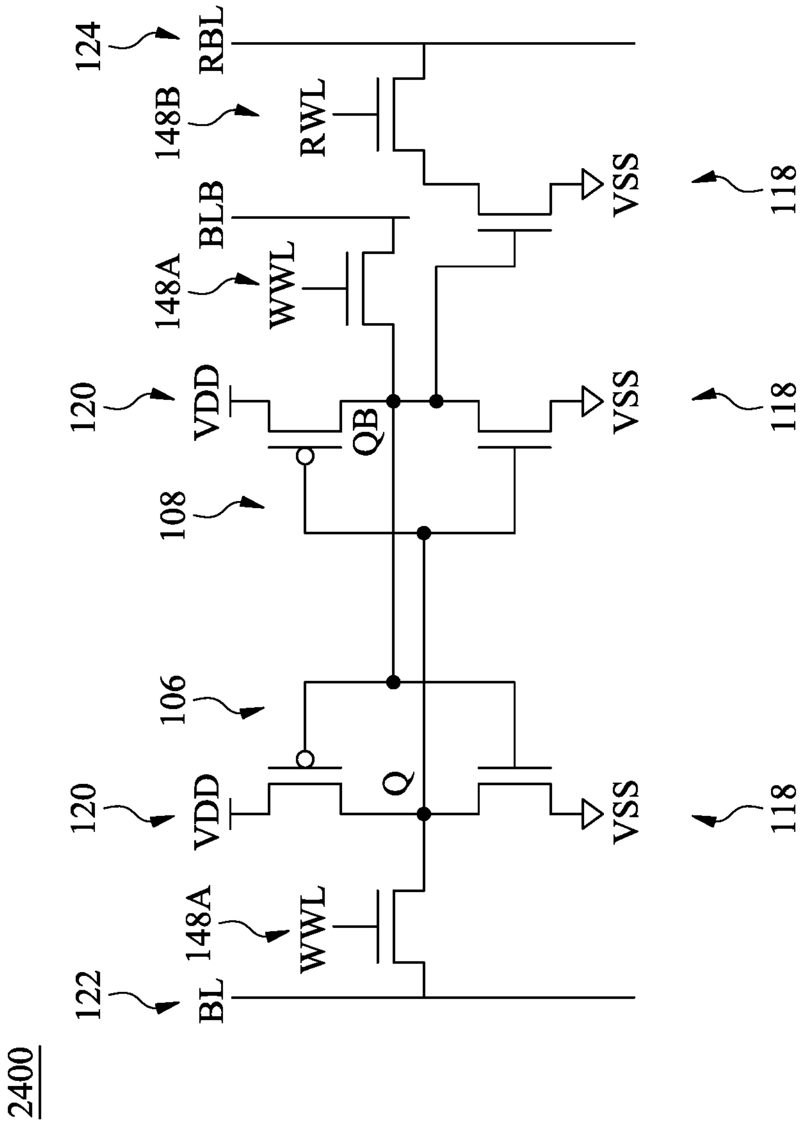
FIG. 24 illustrates a circuit corresponding to the semiconductor device of FIGS. 14-23C, in accordance with some embodiments.

Referring now to FIG. 24, a schematic diagram 2400 for a circuit corresponding to an 8 T SRAM memory cell 100 of a semiconductor device 300 is provided, in accordance with some embodiments. The schematic diagram 2400 includes a first inverter 106 cross-coupled with a second inverter 108. Each of the first inverter 106 and the second inverter 108 includes a pull-up/pull-down transistor pair to each of a respective first voltage 118, depicted as VSS, and second voltage 120, depicted as VDD. A write word line 148A selectively connects the respective inverters 106, 108 to each of a first bit line 122 and a second bit line 124. A read word line 148B selectively connects the respective inverters 106, 108 to each of a voltage level and the first bit line 122.

In one aspect of the present disclosure, a method for fabricating semiconductor packages is disclosed. The method includes depositing a metal to form a gate layer for a first memory cell in a metallization layer 304 of the semiconductor device. The method includes forming a plurality of semiconductor channels separated from the gate layer by a gate oxide layer. The method includes defining a plurality of gates from the gate layer. The method includes interconnecting the plurality of gates and the plurality of semiconductor channels to form a memory cell, wherein the interconnection comprises a plurality of mezzanine levels.

In another aspect of the present disclosure, a semiconductor device is disclosed. The semiconductor device includes a plurality of gate layers each comprising a plurality of gates disposed laterally along a surface of the semiconductor device, the plurality of gates intermediated by an interlayer dielectric. The semiconductor device includes a plurality of drain/source connections electrically connected to a plurality of semiconductor channels. The drain/source connections are electrically couples to a plurality of word line via structures. The drain/source connections are electrically couples to a connection to a first voltage level and a second voltage level for each of a pair of cross-coupled inverters, wherein the plurality of gate layers are engaged by a different threshold voltage.

In another aspect of the present disclosure, a system is disclosed. The system includes a plurality of metallization layers over a semiconductor die. A first of the metallization layers includes a first gate oxide intermediating a plurality of first semiconductor channels from a first gate layer, the plurality of first semiconductor channels forming a first cross-coupled inverter pair configured as a first storage node and a first complementary storage node. The first of the metallization layers further includes a controller configured to convey first data between the first storage node and the semiconductor die. A second of the metallization layers can include a second gate oxide intermediating a plurality of second semiconductor channels from a second gate layer, the plurality of second semiconductor channels forming a second cross-coupled inverter pair configured as a second storage node and a second complementary storage node. The second of the metallization layers can include a second controller configured to convey second data between the second storage node and the semiconductor die. The plurality of metallization layers includes a first further plurality the metallization layers comprising a plurality of first mezzanine levels configured to interconnect the first of the metallization layers. The plurality of metallization layers includes a second further plurality of the metallization layers comprising a plurality of second mezzanine levels configured to interconnect the second of the metallization layers.

In another aspect of the present disclosure, a method for fabricating semiconductor packages is disclosed. The method includes forming a gate layer in one of a plurality of metallization layers of over a semiconductor substrate. The method includes defining a plurality of gates from the gate layer. The method includes forming a gate oxide layer over the gates. The method includes forming a plurality of semiconductor channels separated from the gate layer by the gate oxide layer, the semiconductor channels to define transistors of a first memory cell. The method includes interconnecting the plurality of gates and the plurality of semiconductor channels to form the first memory cell, wherein the interconnection comprises a plurality of layers of a metallization structure.

In another aspect of the present disclosure, a semiconductor device is disclosed. The semiconductor device includes a first metallization layer having a plurality of first conductors laterally separated from one another. The semiconductor device includes a plurality of first semiconductor channels disposed over the first metallization layer. The semiconductor device includes a second metallization layer disposed over the plurality of first semiconductor channels and having a plurality of second conductors. The semiconductor device includes a third metallization layer disposed over the second metallization layer and having a plurality of third conductors. At least four of the plurality of first conductors, six of the plurality of first semiconductor channels, three of the plurality of second conductors, and six of the plurality of third conductors can operatively form a memory cell.

In another aspect of the present disclosure, a semiconductor device is disclosed. The semiconductor device includes plurality of gate layers each comprising a plurality of gates laterally intermediated by an interlayer dielectric. The semiconductor device includes a plurality of drain/source connections electrically connected to a plurality of semiconductor channels. The plurality of drain/source connections electrically coupled to a plurality of word line via structures. The plurality of drain/source connections electrically coupled to a connection to a first voltage level and a second voltage level for each of a pair of cross-coupled inverters, wherein the plurality of gate layers are engagable by a different threshold voltage.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
forming a gate layer in one of a plurality of metallization layers disposed over a semiconductor substrate;
defining a plurality of gates from the gate layer;
forming a gate oxide layer over the defined plurality of gates;
forming a plurality of semiconductor channels separated from the gate layer by the gate oxide layer, the semiconductor channels to define transistors of a first memory cell; and
interconnecting selected gates of the plurality of gates and selected semiconductor channels of the plurality of semiconductor channels to form the first memory cell, wherein the interconnection comprises a plurality of layers of a metallization structure.

2. The method of claim 1, wherein the gate layer comprises tantalum nitride (TaN), titanium nitride (TiN), tungsten (W), aluminum (Al), or combinations thereof.

3. The method of claim 1, further comprising:
forming a plurality of metallization layers over the semiconductor substrate, wherein the gate layer is not one of first five metallization layers disposed over the semiconductor substrate.

4. The method of claim 1, further comprising:
forming a second gate layer for a second memory cell, the second gate layer being vertically spaced from the gate layer of the semiconductor device;
forming a plurality of second semiconductor channels separated from the second gate layer by a second gate oxide layer;
defining a plurality of second gates from the second gate layer; and
interconnecting the plurality of second gates and the plurality of second semiconductor channels to form the second memory cell, wherein the interconnection comprises a plurality of second layers of the metallization structure.

5. The method of claim 4, wherein at least one of the layers of the metallization structure is not vertically spaced from at least one of the second layers of the metallization structure.

6. The method of claim 4, wherein a dimension of the semiconductor channels varies from a dimension of the second semiconductor channels, such that an access time or leakage current of the first memory cell varies from an access time or leakage current of the second memory cell.

7. The method of claim 4, wherein the semiconductor channels include a plurality of p-type channels and a plurality of n-type channels, and wherein a dimension of the p-type channels varies from a corresponding dimension of the n-type channels.

8. The method of claim 4, wherein a first of the layers of the metallization structure includes a word line interconnection, a storage node interconnection, and a complementary storage node interconnection.

9. The method of claim 8, wherein a second of the layers of the metallization structure includes a first bit line interconnection and a second bit line interconnection.

10. The method of claim 9, wherein a third of the layers of the metallization structure includes a second word line of the first memory cell, and a word line of the second memory cell.

11. The method of claim 4, wherein the first memory cell and the second memory cell have a different threshold voltage.

12. A method of fabricating a semiconductor device, the method comprising:
forming a gate oxide layer over a gate layer;
patterning the gate oxide layer to form a plurality of gate oxide structures;
forming gate isolation trenches in the gate layer to define a plurality of gates subsequent to forming the gate oxide structures;
forming a plurality of semiconductor channels over and extending upward from the gate oxide structures;
forming a plurality of first conductive contacts over, extending upward from, and in electrical contact with the semiconductor channels simultaneously to forming a plurality of second conductive contacts over, extending upward from, and in electrical contact with the gate layer, wherein the first conductive contacts and the second conductive contacts terminate at a first lateral plane;
forming a plurality of third conductive contacts between the first lateral plane and a second lateral plane; and forming a plurality of first lateral interconnects along the second lateral plane to electrically interconnect the third conductive contacts.

13. The method of claim 12, wherein each of the third conductive contacts are laterally bounded by an electrically coupled second conductive contact or first conductive contact.

14. The method of claim 12, wherein the plurality of first lateral interconnects comprise a word line of a memory cell formed from transistors including the semiconductor channels.

15. The method of claim 14, wherein the plurality of first lateral interconnects comprise a storage node (Q) and a complementary storage node (Q') of the memory cell.

16. The method of claim 14, comprising:

forming a plurality of fourth conductive contacts between the first lateral interconnects and a second lateral plane; and forming a plurality of second lateral interconnects along the second lateral plane to electrically interconnect the fourth conductive contacts.

17. The method of claim 16, wherein the second lateral interconnects comprise a plurality of bit lines for the memory cell.

18. A method of fabricating a semiconductor device, the method comprising:

forming a plurality of metallization layers over an active surface of a semiconductor die, the metallization layers to form circuits along the active surface;

forming a gate layer over the plurality of metallization layers;

forming a plurality of vertical channels, each of the plurality of vertical channels disposed over a gate of a transistor of a memory cell, the plurality of vertical channels coupled with corresponding source/drain regions;

forming first lateral interconnects electrically coupled with corresponding gates to form word lines of the memory cell; and forming second lateral interconnects electrically coupled with the source/drain regions to form a plurality of bit lines of the memory cell.

19. The method of claim 18, further comprising:

operatively coupling the memory cell with the circuits formed along the active surface of the semiconductor die.

20. The method of claim 18, wherein the second lateral interconnects form a storage node (Q) and a complementary storage node (Q') of the memory cell.

* * * * *